United States Patent
Arimura

(10) Patent No.: US 6,236,140 B1
(45) Date of Patent: May 22, 2001

(54) PIEZOELECTRIC VIBRATION DEVICE

(75) Inventor: Hiroyuki Arimura, Hyogo (JP)

(73) Assignee: Daishinku Corporation, Hyogo (JP)

( * ) Notice: Subject to any disclaimer, the term of this patent is extended or adjusted under 35 U.S.C. 154(b) by 0 days.

(21) Appl. No.: 09/043,117

(22) PCT Filed: Jul. 24, 1997

(86) PCT No.: PCT/JP97/02597

§ 371 Date: Mar. 17, 1998

§ 102(e) Date: Mar. 17, 1998

(87) PCT Pub. No.: WO98/05121

PCT Pub. Date: Feb. 5, 1998

(30) Foreign Application Priority Data

Jul. 31, 1996 (JP) .................................................. 8-219383
Mar. 3, 1997 (JP) .................................................. 9-048215

(51) Int. Cl.$^7$ ............................................... H01L 41/04
(52) U.S. Cl. ......................... 310/312; 310/366; 310/320
(58) Field of Search ................................. 310/312, 320, 310/365, 366

(56) References Cited

U.S. PATENT DOCUMENTS

| 3,573,672 | * | 4/1971 | Fair .................................. | 310/312 X |
|---|---|---|---|---|
| 3,781,577 | * | 12/1973 | Nonaka et al. ..................... | 310/365 |
| 4,218,631 | * | 8/1980 | Yamaguchi ......................... | 310/312 |
| 4,326,142 | * | 4/1982 | Mattuschka ........................ | 310/320 |
| 4,370,584 | * | 1/1983 | Ikeno et al. ........................ | 310/365 |
| 4,447,753 | * | 5/1984 | Ochiai ................................ | 310/312 |
| 4,484,382 | * | 11/1984 | Kawashima ..................... | 310/312 X |
| 4,642,505 | * | 2/1987 | Arvanitis ............................. | 310/312 |
| 4,870,313 | * | 9/1989 | Hirama et al. ...................... | 310/312 |
| 5,736,911 | * | 4/1998 | Watanabe ........................ | 310/312 X |

FOREIGN PATENT DOCUMENTS

| 0204582 | * | 11/1983 | (DE) ................................... | 310/312 |
|---|---|---|---|---|
| 0116810 | * | 7/1983 | (JP) .................................... | 310/312 |
| 0147613 | * | 7/1986 | (JP) .................................... | 310/312 |

* cited by examiner

Primary Examiner—Mark O. Budd
(74) Attorney, Agent, or Firm—Arent Fox Kintner Plotkin & Kahn, PLLC

(57) ABSTRACT

A piezoelectric vibration device utilizes a thickness-shear vibration available for communication devices or the like. The piezoelectric vibration device has a structure wherein at least one of each peripheral zone of an input electrode (21) and an output electrode (22), or a common electrode (23), where the non-harmonic overtone mode is relatively strongly excited, is partially provided with either a weight reducing portion (231, 232) or a weight adding portion. Moreover, an area of the common electrode (23) is larger than a total area of the input electrode (21) and the output electrode (22), and either the weight reducing portion (231, 232) or the weight adding portion reaches the common electrode (23) opposed to the input electrode (21) and the output electrode (22). Preferably, the common electrode formed on one principal plane of a quartz plate (1) is twice to 10 times as thick as the input electrode (21) and the output electrode (22) formed on the other principal plane. As an electrode material, any of gold, silver, or a metal material mainly composed of gold or silver is employed, whereby the spurious vibration mode generated near the principal vibration is restrained, the pass band characteristics are excellent and wider, and the guarantee attenuation characteristics in the portions outside of the pass band are enhanced.

36 Claims, 20 Drawing Sheets

PIEZOELECTRIC VIBRATION DEVICE

BACKGROUND OF THE INVENTION

1. Field of the Invention

The present invention relates to a piezoelectric vibration device utilizing a thickness-shear vibration available for communication devices or the like. In giving particulars, the present invention relates to a piezoelectric vibration device which can restrain influences by a spurious vibration or an unnecessary vibration of the general non-harmonic overtone mode, and enhance guarantee attenuation characteristics.

2. Description of the Prior Art

Referring to FIGS. 31 and 32, prior art is described as below.

FIG. 31 is a diagram of an electrode structure and a vibrational energy distribution of spurious vibration of non-harmonic overtone mode, generally referred to as a (3,1,3) mode, seen from a bottom surface of a conventional piezoelectric vibration device. FIG. 32 is a sectional view along line S—S in FIG. 31 and a diagram of the vibrational energy distribution of spurious vibration of a principal vibration mode (substantial line) and the (3,1,3) mode. Each symbol of (3,1,3) designates an order of overtone in a Y'-axis (thickness) direction, an order of overtone in an X'-axis direction, and an order of overtone in a Z'-axis direction. As shown in FIG. 31, the (3,1,3) mode is a mode of the spurious vibration having three vibration crests (troughs) arranged in parallel to the Z'-axis direction.

As a quartz plate 90, an AT cut quartz plate is employed. A principal plane of the quartz plate 90 is provided with an input electrode 191, an output electrode 192, outgoing electrodes 191a, 192a for leading the input electrode 191 and the output electrode 192 to peripheral portion of the quartz plate 90, and the other principal plane of the quartz plate 90 is provided with a common electrode 193, and an outgoing electrode 193a for leading the common electrode 193 to the peripheral portion of the quartz plate 90. Each electrode is formed by means of thin film forming means using vacuum evaporation method or the like. Though it is not shown, the input and output electrodes 191, 192 are respectively connected to an input terminal and an output terminal, the common electrode 193 is hermetically confined in a state of being connected to a grounding terminal.

In the piezoelectric vibration device having such a structure, the input and output electrodes 191, 192 formed oppositely each other in a state wherein the quartz plate 90 intervenes therebetween and the common electrode 193 are designated as resonant areas, a symmetrical mode (fs) and oblique symmetrical mode vibration (fa) are confined by the electrodes, they are acoustically coupled thereby forming a multiple mode principal vibration with the result that the piezoelectric vibration device having pass band characteristics as a predetermined filter is designed.

Moreover, in the prior art, as high-frequency type or three-order overtone type electrode materials, aluminium is generally employed.

As mentioned above, the piezoelectric vibration device is designed so that, as well as the principal vibration, a higher-order non-harmonic overtone mode such as the spurious vibration of the (3,1,3) mode is confined by the electrodes, thus exciting them simultaneously. Furthermore, as well: as such a mode, there are various spurious vibrations such as one referred as to a (3,3,1) mode having three crests (or troughs) of vibration arranged in parallel in the X-axis direction, or a vibration mode having three crests (or troughs) of vibration respectively in the axis direction. These spurious vibrations wherein energy is confined under exciting electrodes, thus exciting the vibration as a standing wave relatively strongly, have problems wherein spurious vibrations affect the principal vibration, the spurious vibrations disorders the pass band characteristics, and the guarantee attenuation characteristics in portions outside of the pass band are not obtained enough. In case of employing aluminium as the electrode material in the same way as prior art, it is easy to oxidize aluminium, thus resulting in bad yield and productivity. In addition, in case that aluminium oxide is formed by oxidizing aluminium, a conductive resistance to a conductive adhesive is greater so that the guarantee attenuation characteristics are inferior.

SUMMARY OF THE INVENTION

In order to solve the problems, an object of the present invention is to provide a piezoelectric vibration device for restraining the spurious vibration mode generated near the principal vibration (what is called "frequency"), making the pass band characteristics more excellent and wider, and enhancing the guarantee attenuation characteristics in the portions outside of the pass band.

In order to achieve the object of the present invention, a piezoelectric vibration device utilizing a thickness-shear vibration having a resonant area formed by an input electrode, an output electrode and a common electrode, the piezoelectric vibration device comprises a quartz plate having a pair of principal planes, the input electrode and the output electrode disposed on a principal plane of the quartz plate, the input electrode and the output electrode formed close to each other at a regular interval, and the common electrode disposed on the other principal plane of the quartz plate, corresponding to the input electrode and the output electrode, wherein either a weight reducing portion or a weight adding portion is partially disposed on at least one of each peripheral zone of the input electrode, the output electrode and the common electrode.

In a three-pole-type piezoelectric vibration device utilizing a thickness-shear vibration having a resonant area formed by an input electrode, an output electrode, a grounding electrode and a common electrode, the piezoelectric vibration device comprising a quartz plate having a pair of principal planes, the input electrode and the output electrode disposed on a principal plane of the quartz plate, the grounding electrode interposed between the electrodes, in which the input electrode, the output electrode and the grounding electrode are formed close to each other at regular intervals, and the common electrode disposed on the other principal plane of the quartz plate, corresponding to the input electrode, the output electrode, and the grounding electrode, and in a four-pole-type piezoelectric vibration device utilizing a thickness-shear vibration having resonant areas formed by two pairs of input and output electrodes and common electrodes, the piezoelectric vibration device comprising a quartz plate having a pair of principal planes, the two pairs of input and output electrodes respectively including an input electrode and an output electrode, disposed on a principal plane of the quartz plate in parallel, in which input electrode and the output electrode are formed close to each other at a regular interval, and the common electrodes disposed on the other principal plane of the quartz plate, corresponding to the respective pairs of input and output electrodes, the weight reducing portion or the weight adding portion is applicable.

Preferably, either the weight reducing portion or the weight adding portion is disposed on a portion where a vibrational energy of a spurious vibration generated in excitation of the piezoelectric vibration device is relatively greater than that of a principal vibration.

In addition, the piezoelectric vibration device comprises a quartz plate having a pair of principal planes, a rectangular input electrode and a rectangular output electrode disposed on a principal plane of the quartz plate, the input electrode and the output electrode formed close to each other at a regular interval, a rectangular common electrode disposed on the other principal plane of the quartz plate, corresponding to the input electrode and the output electrode, and a resonant area formed by the input electrode, the output electrode and the common electrode, in which the piezoelectric vibration device utilizing a thickness-shear vibration includes an outgoing electrode for leading the each electrode to peripheral ends of the quartz plate, and either the weight reducing portion or the weight adding port-ion is disposed on at least one center of far sides where the input electrode and the output electrode are opposite to each other, at least one center of far sides opposite to the common electrode, or at least one center of the far sides where the input electrode and the output electrode are opposite to each other as well as at least one center of the far sides opposite to the common electrode.

In the piezoelectric vibration device, the weight reducing portion may be provided with a notch, and designed by a concave portion formed by removing a whole or a part of the electrode corresponding to each predetermined portion of the electrodes.

Moreover, the weight adding portion may be designed so that a part or a whole of the electrode may be formed thickly or so that resin materials may be partially or wholly added to the electrode.

Furthermore, an area of the common electrode is formed to be larger than a total area of the input electrode and the output electrode, and the peripheral zone of the common electrode is at least partially provided with either the weight reducing portion or the weight adding portion which reaches the common electrode opposite to the input electrode and the output electrode.

In the piezoelectric vibration device according to the present invention, the electrode formed on one principal plane of the quartz plate may be thickly formed structurally.

Preferably, in the piezoelectric vibration device, the common electrode formed on one principal plane of the quartz plate is twice to 10 times as thick as the input electrode and the output electrode formed on the other principal plane.

In the piezoelectric vibration device according to the present invention, preferably, the electrode formed on one principal plane of the quartz plate is made of a metal material mainly composed of gold or silver, gold or silver.

As shown in FIG. 10, in the spurious vibration of the non-harmonic overtone mode, it is well known that the vibration energy distribution is inclined rather more outwardly than the principal vibration mode generated by coupling a symmetrical mode vibration (fs) and an oblique symmetrical mode vibration (fa) acoustically, and in the peripheral zone of the common electrode which is opposed to the input electrode and the output electrode, the vibration energy of the spurious vibration is higher than that of the principal vibration. Herein, according to the present invention, the peripheral zone of the common electrode is provided with the weight reducing portion or the weight adding portion, as it is obvious from the vibration energy distribution as shown in FIG. 1, a balance of the spurious vibration is extremely lost, thus weakening the vibration energy of the spurious vibration as a whole.

Also, in the three-pole-type or the four-pole-type piezoelectric vibration device, the spurious vibration can be shifted, thus weakening the vibration energy in the same way.

Moreover, by a structure of the weight reducing portion or the weight adding portion, the principal vibration mode is concentrated on a center of an exciting electrode with the result that the acoustic couple between the symmetrical mode vibration (fs) and the oblique symmetrical mode vibration (fa) is reinforced to extend the width of the pass band in the piezoelectric vibration device.

Moreover, an area of the common electrode is larger than the total area of the input electrode and the output electrode opposite thereto, whereby, for example, the non-harmonic overtone mode is inclined more outwardly than the energy distribution of the vibration. In such a state, the periphery of the common electrode is at least partially provided with either the weight reducing portion or the weight adding portion, which structurally reaches the common electrode opposite thereto, so that the non-harmonic overtone mode itself loses the balance, thus damping the vibration energy much efficiently. Though, generally, the electrode area is larger, thereby making it possible to lower a driving-impedance, various kinds of spurious vibrations are simultaneously reinforced. On the other hand, according to the present invention, the weight reducing portion or the weight adding portion is provided whereby the spurious vibration can be weakened to a level adapted for practical use.

The piezoelectric vibration device has a structure wherein the electrode formed on either principal plane of the quartz plate is thickly formed, whereby a boundary condition formed by the peripheral end surface of the exciting electrode is further emphasized to produce efficiently an effect obtained by disposing the weight reducing portion or the weight adding portion, thus enhancing an effect on the spurious restriction.

Preferably, the common electrode formed on one principal plane of the quartz plate is twice to 10 times as thick as the input electrode and the output electrode formed on the other principal plane, in order to release the energy of the spurious vibration outwardly, and a boundary condition formed by the peripheral end surface of the exciting electrode is much emphasized, which makes it possible to produce an effect obtained by disposing the weight reducing portion or the weight adding portion, thus enhancing an effect on the spurious restriction and the guarantee attenuation characteristics.

In case that-the electrode is made of a metal material mainly composed of gold or silver, and the spurious vibration is a thickness-shear non-harmonic vibration as mentioned above, owing to the electrode structure made of the metal whose relative density is greater, the decrease amount of frequency of the non-harmonic vibration is smaller than that of the principal vibration, the spurious vibration is seemingly higher frequency than the principal vibration. That is, the spurious vibration can be far from the principal vibration. In addition, it is not easier to oxidize silver than aluminium, there is no possibility wherein the conductive resistance to the conductive adhesive is not increased, thus enhancing the attenuation characteristics.

DETAILED DESCRIPTION OF THE PREFERRED EMBODIMENTS

Figure 1:
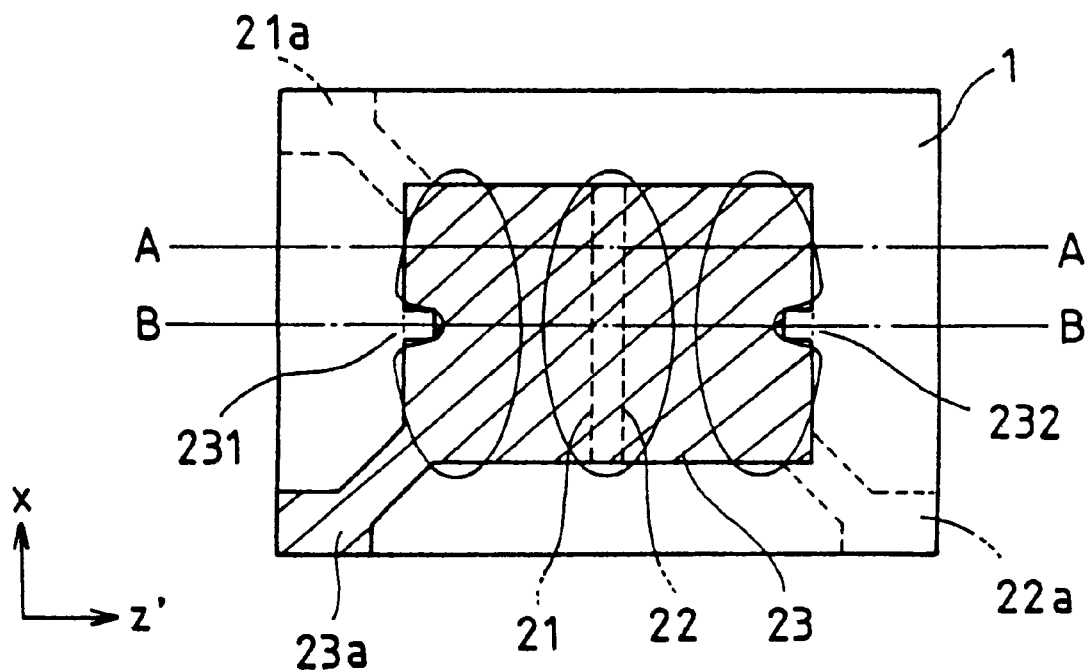
FIG. 1 is a plan view showing a principal plane having a common electrode in a first embodiment of a monolithic crystal filter of a preferable piezoelectric vibration device according to the present invention.

Referring now to the drawings, preferred embodiments of the invention are described in detail below.

Figure 2:
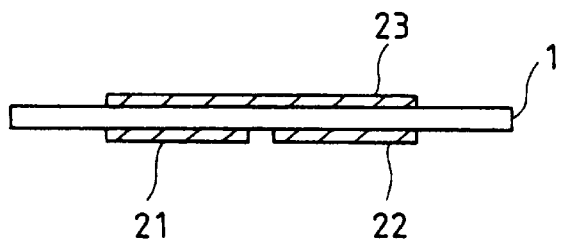
FIG. 2 is a sectional view along A—A line in FIG. 1.
Figure 3:
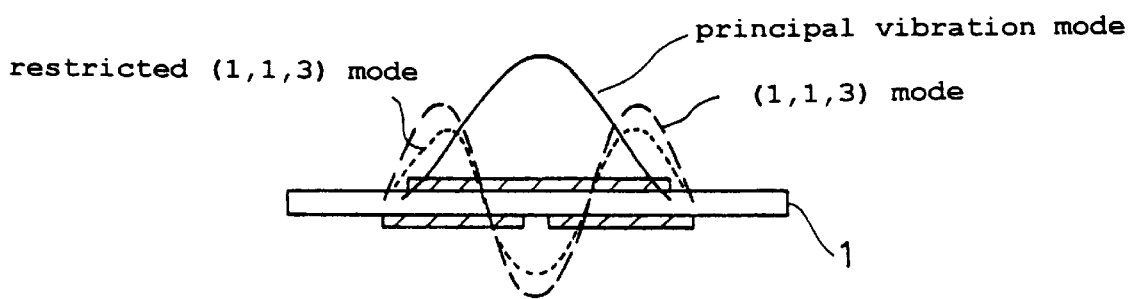
FIG. 3 is a sectional view along B—B line in FIG. 1.

FIG. 1, FIG. 2 and FIG. 3 are explanatory diagrams of a first embodiment according to the present invention, employing a monolithic crystal filter. FIG. 1 is a plan view of a principal plane having a common electrode. FIG. 2 is a sectional view along line A—A in FIG. 1. FIG. 3 is a sectional view along line B—B in FIG. 1. FIG. 1 and FIG. 3 illustrate typically a vibration energy distribution state of a principal vibration mode and a vibration energy of (3,1,3) mode, i.e., one of the spurious vibration.

As the quartz plate 1, an AT cut quartz plate is employed, which is worked rectangularly. On one principal plate (bottom surface) of the quartz plate 1, a pair of a rectangular input electrode 21 and a rectangular output electrode 22 are formed close to each other, at a predetermined interval in a Z'-axis direction. The input electrode 21 and the output electrode 22 are led to each corner positioned on a diagonal line of the quartz plate 1 by the outgoing electrodes 21a, 22a. Moreover, on the other principal plane (upper surface), opposite to the input electrode 21 and output electrode 22, a rectangular common electrode 23 is formed, the common electrode 23 is led to the other corner of the quartz plate 1 by the outgoing electrode 23a, to connected to a grounding terminal (not shown). A central portion of a shorter side of the common electrode 23 is provided with notches 231, 232. As illustrated obviously in sectional views in FIGS. 2 and 3, the positions of the peripheral ends of the input electrode 21, the output electrode 22 and the common electrode 23 are predetermined at the approximately same position as the other principal plane each other (upper and bottom surface), and notches 231, 232 of the common electrode 23 are scooped inwardly.

Figure 12:
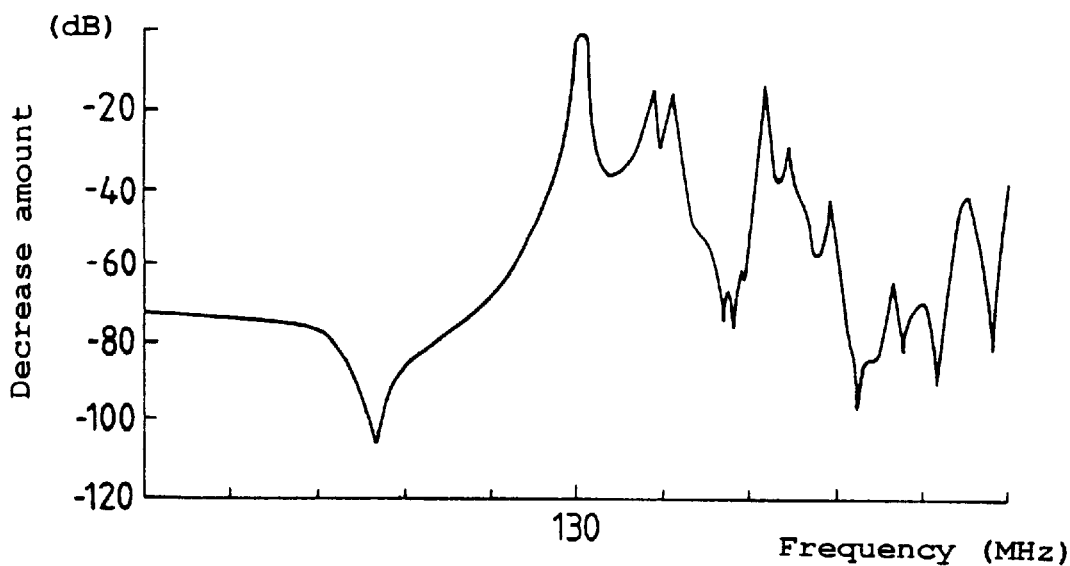
FIG. 12 is a graph showing a frequency characteristic of the first embodiment as shown in FIG. 1.
Figure 22:
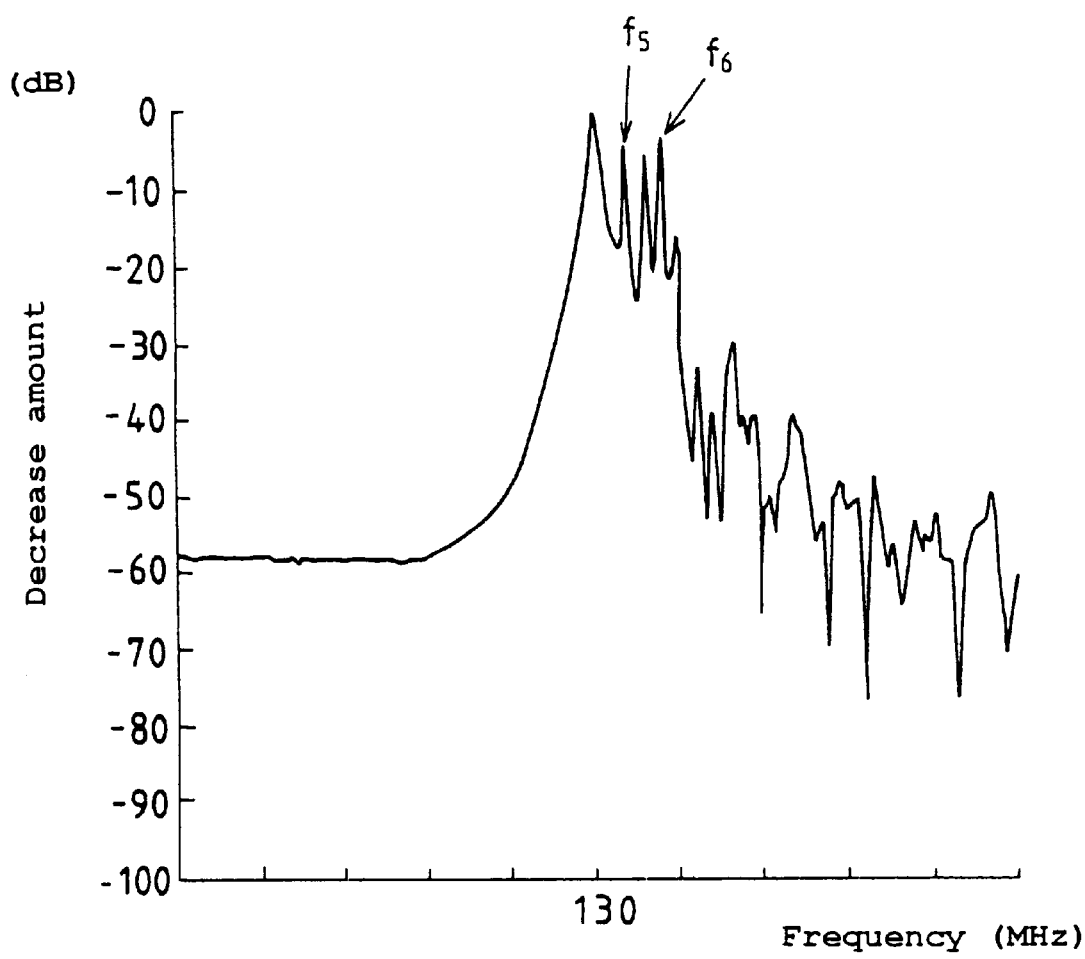
FIG. 22 is a graph showing a frequency characteristic under a condition wherein the electrode material is aluminium in the electrode structure as shown in FIG. 21.

In case of exciting the monolithic crystal filter having the above structure, it shows a frequency characteristic shown in FIG. 12. Compared with FIG. 22 showing the frequency characteristic of the monolithic crystal filter in prior art, in the embodiment according to the present embodiment, a spurious vibration such as a non-harmonic overtone mode having a relative great vibration energy conventionally is damped. This is owing to characteristic electrode structure in the present embodiment, an electric field is not added to notches 231, 232, whereby it seems to be the reason that exciting according to counter piezoelectric effect is not performed. In other words, it is thought that, according to the vibration energy distribution, as shown in FIG. 1, the vibration loses the balance along the notches 231, 232, the vibration energy of the non-harmonic overtone mode as shown in FIG. 3 is restricted to be weakened. Moreover, the pass band of the present invention is wider than that of the prior art though it is hard to recognize it in FIG. 12.

The monolithic crystal filter employed for the present invention is a rectangular shaped AT cut quartz plate, being 2.5 mm by 5, having a center frequency thereof predetermined at 130 MHz, wherein a pair of rectangular electrodes having longer sides of 0.78 mm, shorter sides of 0.56 mm are formed on the back side at an interval of 0.1 mm between the electrodes, and a common electrode opposite to the pair of the input and output electrodes, having a size almost correspond thereto is formed on the surface. Therefore, the common electrode of the present invention has a different shape from that of the prior art. As a shape of electrode for reducing the weight, for example, notches formed on the common electrode are illustrated according to the present embodiment. A shape of the notch is not limited to the shape illustrated in the present embodiment, and a shape and a size which do not have influence on displacement distribution of the principal vibration mode are allowed, including a curve shape.

The monolithic crystal filter has structures not shown, in other words, one structure wherein a base having lead terminals respectively connected to a supporting body is prepared, and the quartz plate 1 of the above electrode structure may be supported by the supporting body connected to the lead terminals to be hermetic by a cap, and another structure wherein the quartz plate may be mounted on a package having an outer leading electrode pad thereby being hermetic.

As a shape of the electrode for reducing the weight, a second embodiment, or a structure wherein electrode portions in predetermined portions of the electrode are removed to form a piercing hole, is described below.

Figure 4:
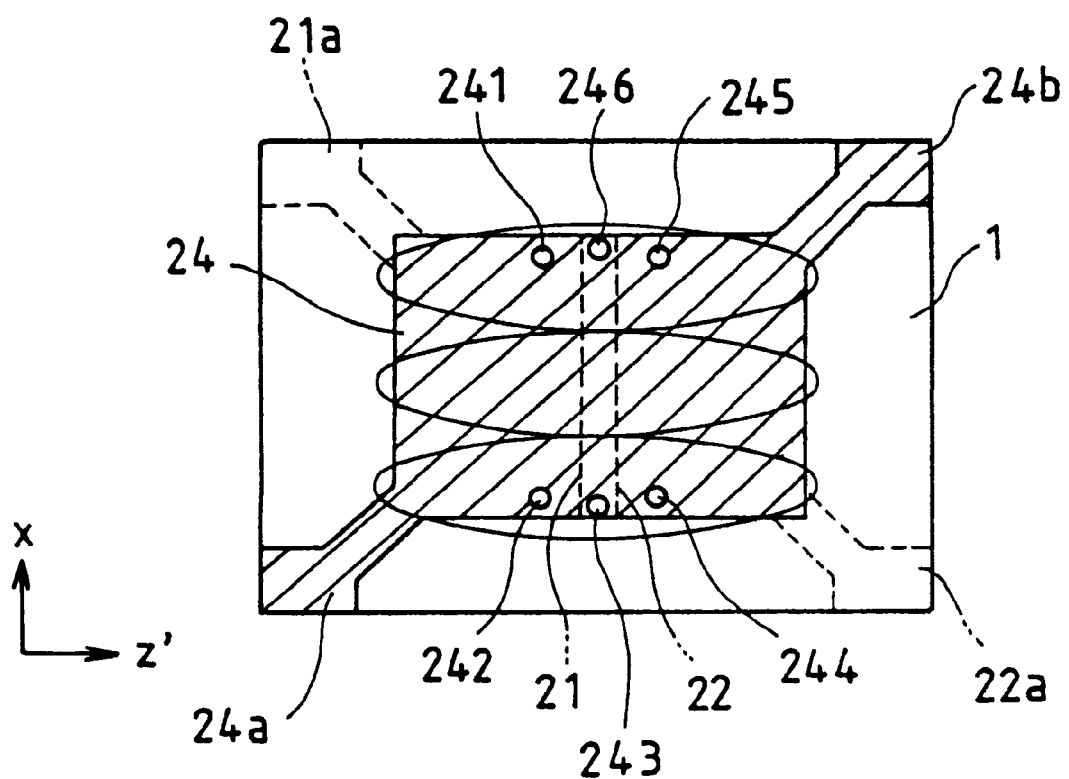
FIG. 4 is a plan view showing a principal plane having a common electrode in a second embodiment according to the present invention.

FIG. 4 is a plan view of a back surface where a common electrode is formed so as to illustrate the structure of the second embodiment. The same elements as those in the first embodiment are allocated to the same references and the description thereof is omitted.

In this embodiment, a common electrode 24 is led to each corner positioned on a diagonal line on the quartz plate 1 by outgoing electrodes 24a, 24b.

The common electrode 24 formed on the back surface of the quartz plate 1 is provided with a number of pits 241, 242, 243, 244, 245, 246, the portions where these pits are formed are areas where the spurious vibration of the (3,3,1) mode is relatively strongly excited. The each pit can be formed by well-known means such as removing the electric material of the predetermined portions by emitting laser beams after forming the exciting electrodes. By such an arrangement, it is thought that the spurious vibration of the (3,3,1) mode loses the balance to damp the vibration energy.

Though the second embodiment has a structure wherein the piercing hole is formed on the common electrode, the structure is not limited to the piercing hole, the structure wherein a part of the electrode is made thinly to form the pit (concave), is allowed. Moreover, the structure wherein these piercing holes and pits are mixed with the mentioned-above notches may be allowed.

Figure 5:
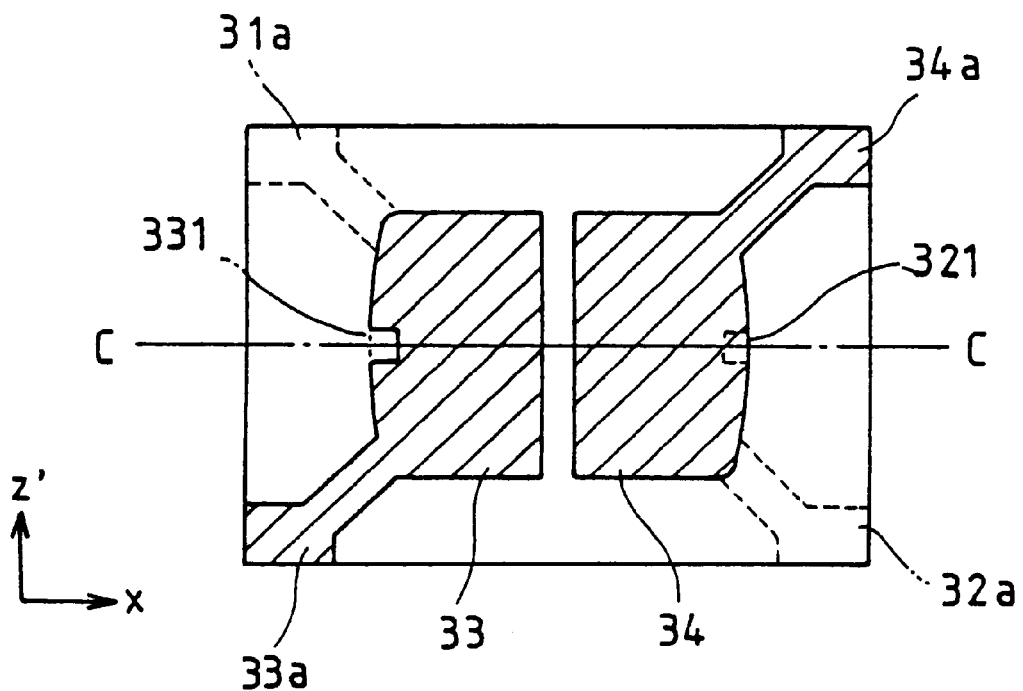
FIG. 5 is a plan view showing a principal plane having a common electrode in a third embodiment according to the present invention.
Figure 6:
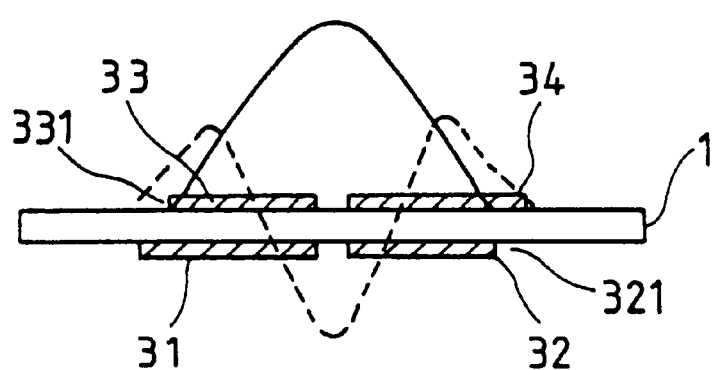
FIG. 6 is a sectional view along C—C line in FIG. 5.

Furthermore, as an electrode shape for reducing the weight, a third embodiment for illustrating a structure wherein the electrode as shown in FIGS. 5 and 6 is formed is described as below.

FIG. 5 showing a structure of the third embodiment is a plan view of the back surface where the common electrode is formed. FIG. 6 is a sectional view along C—C line in FIG. 5. The same elements as those in the first embodiment are allocated to the same numerals and the description thereof is omitted.

On one principal plane, an input electrode 31 and an output electrode 32 are formed in parallel to a Z'-axis direction, at a predetermined interval therebetween, close to each other. The input electrode 31 and the output electrode 32 are led to each corner positioned on each diagonal line on the quartz plate 1 by outgoing electrodes 31a, 32a. On the other principal plane, common electrodes 33 and 34 are formed opposite to the input electrode 31 and the output electrode 32. These common electrodes 33, 34 are led to each corner positioned on each diagonal line on the quartz plate 1 by outgoing electrodes 33a, 34a. Moreover, each electrode has an arrangement wherein a pair of the input electrode 31 and the output electrode 32, and a pair of the common electrodes 33, 34 have far sides being arc shaped, opposite to each other in an X-axis direction. By the arrangement, a shape thereof is partially similar to the oval vibration energy distribution, thus making it possible to adopt it. Though the embodiment employs an arrangement wherein the electrodes are arranged in parallel to the X-axis direction, it is an optional matter selected depending on desired electric characteristics such as a necessity for extending the pass band.

The third embodiment, in order to reduce the weight, has an arrangement wherein a notch 331 is formed at a center of the circular arc shaped end of the common electrode 33 and a notch 321 is formed at a center of the circular arc shaped end of the output electrode 32. The arrangement wherein those notches are formed, in the same way as the first and second embodiments, can make the vibration energy of the spurious vibration of: the non-harmonic overtone mode or the like be damped.

Figure 7:
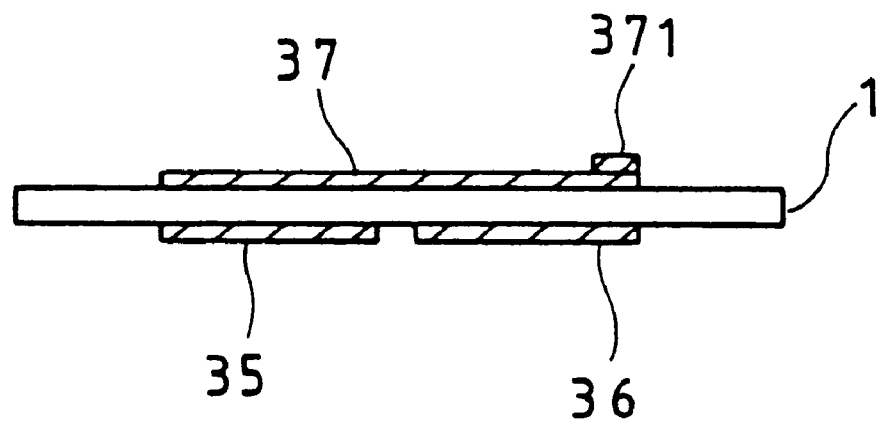
FIG. 7 is a sectional view showing a fourth embodiment according to the present invention.

A fourth embodiment is described as below, referring to FIG. 7 of a sectional view of a monolithic crystal filter having a shape of an electrode to which a weight is added.

Figure 31:
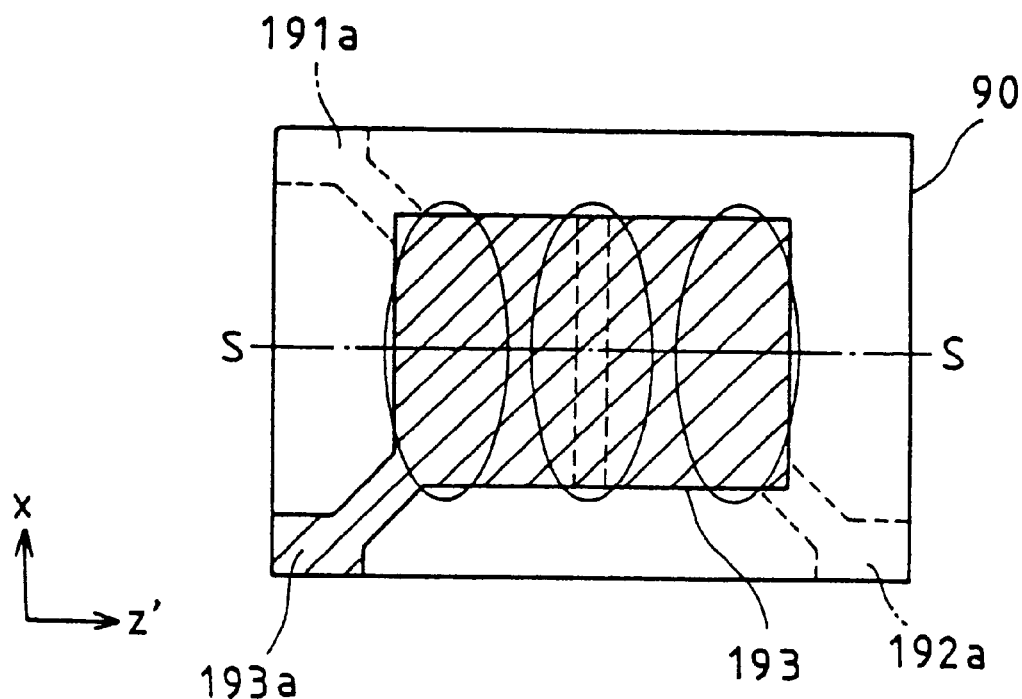
FIG. 31 is a plan view showing a principal plane having a common electrode of a conventional piezoelectric vibration device.
Figure 32:
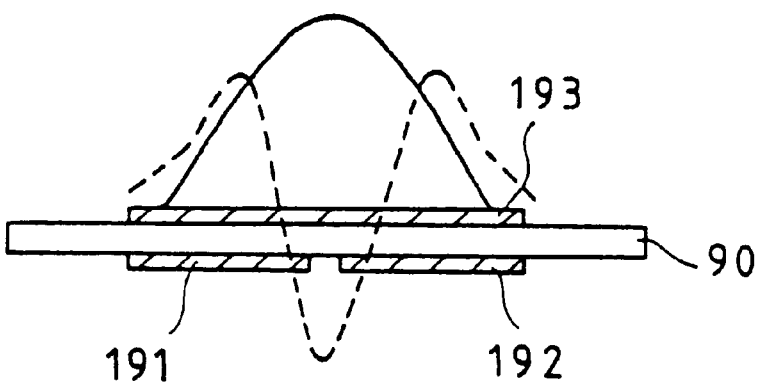
FIG. 32 is a sectional view along S—S line in FIG. 31.

In the same electrode structure of the present invention as that of the prior art in FIG. 31, an additional electrode 371 made of the same material as that of a common electrode 37 is formed at one end of the electrode 37. The forming portion of the additional electrode 371 is a portion where the non-harmonic overtone mode is relatively strongly excited, thereby damping the spurious vibration of the non-harmonic overtone mode or the like.

Figure 9:
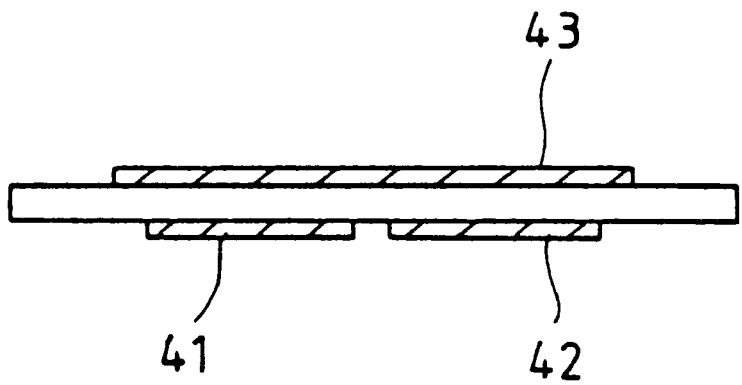
FIG. 9 is a sectional view along D—D line in FIG. 8.
Figure 10:
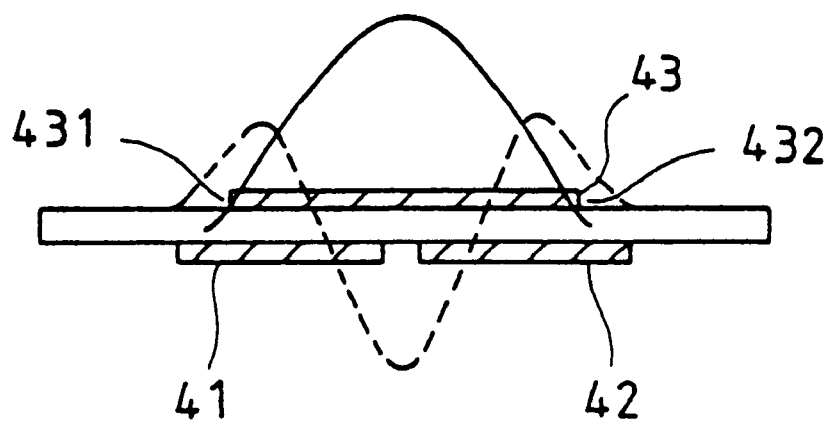
FIG. 10 is a sectional view along E—E line in FIG. 8.

A fifth embodiment is described as below, referring to FIGS. 8 to 10.

Figure 8:
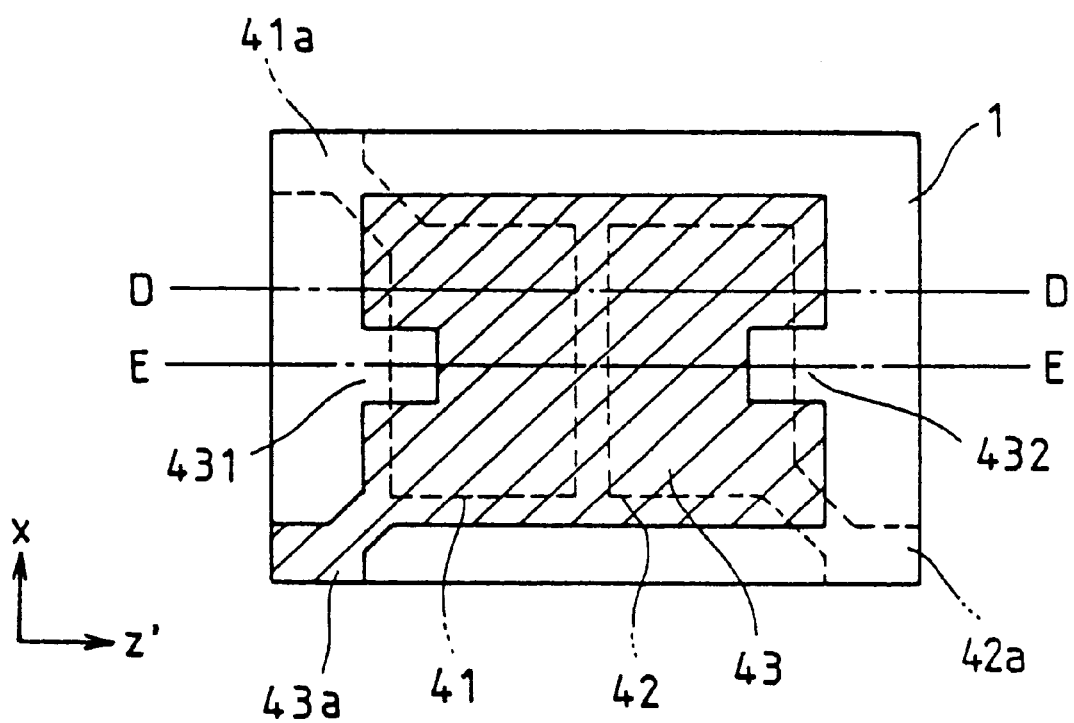
FIG. 8 is a plan view showing a principal plane having a common electrode in a fifth embodiment according to the present invention.

FIG. 8 is a plan view of the principal plane on the common electrode side. FIG. 9 is a sectional view along D—D line in FIG. 8. FIG. 10 is a sectional view along E—E line in FIG. 8.

According to the embodiment, a rectangular common electrode 43 formed on one principal plane has four sides being longer than those of a rectangular input electrode 41 and a rectangular output electrode 42 formed on the other principal plane, so as to cover the both of the input electrode 41 and the output electrode 42. Notches 431, 432 are formed at the each center of shorter sides opposite to the common electrode 43. The depth of the notches reaches the common electrode 43 opposite to the input and output electrodes 41, 42 formed on the back side.

The common electrode 43 is led to another corner of the quartz plate 1 by an outgoing electrode 43a, to be connected to a grounding terminal (not shown). Moreover, the input electrode 41 and the output electrode 42 are led to each corner positioned on a diagonal line on the quartz plate 1 by outgoing electrodes 41a, 42a.

By adopting the above mentioned structure, especially the non-harmonic overtone mode loses the balance owing to the vibration energy distribution in a state wherein the non-harmonic overtone mode is inclined much outwardly, thus damping the vibration energy extremely efficiently. Generally, the electrode area is increased, thus making it possible to lower the driving impedance, on the other hand, causing a problem wherein various kinds of the spurious vibrations are stronger simultaneously. However, by employing a structure of the electrode shape for reducing the weight, or a structure of the electrode shape for adding the weight, the spurious vibration can be weakened to a practical use level.

Figure 20:
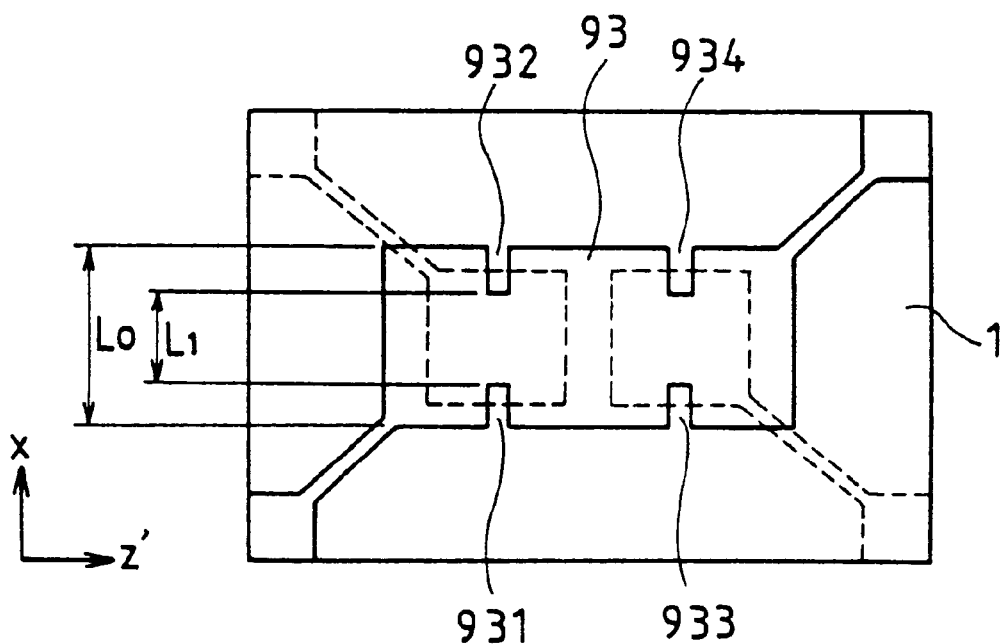
FIG. 20 is a plan view showing a principal plane having a common electrode in another modification of the sixth embodiment according to the present invention.

In a structure shown in FIG. 8, notches are positioned in a Z'-axis direction so as to face opposite to each other. However, positions thereof are not limited to the Z'-axis direction, notches 931, 932, 933, 934 may be structurally formed in an X-axis direction on a common electrode 93 as shown in FIG. 20. In case that the structure as shown in FIG. 20 wherein the common electrode has shorter sides $L_0$ of 1.30 mm, and the input and output electrodes have each width $L_2$ of 0.78 mm, a relation between an X-axis directional distance $L_1$ from one notch to the other disposed in the X-axis direction so as to be opposite to each other, and a spurious damping amount is illustrated in Table 1.

TABLE 1

| L1 (mm) | Spurious Damping Amount (dB) |
| --- | --- |
| 1.30 | 3 |
| 0.59 | 12 |
| 0.54 | 13 |
| 0.49 | 15 |

As it is obvious from the above table, with $L_1$ is less, in other words, the depth of the notches is greater, the damping amount of the spurious vibration is greater, leading to being preferable.

Figure 13:
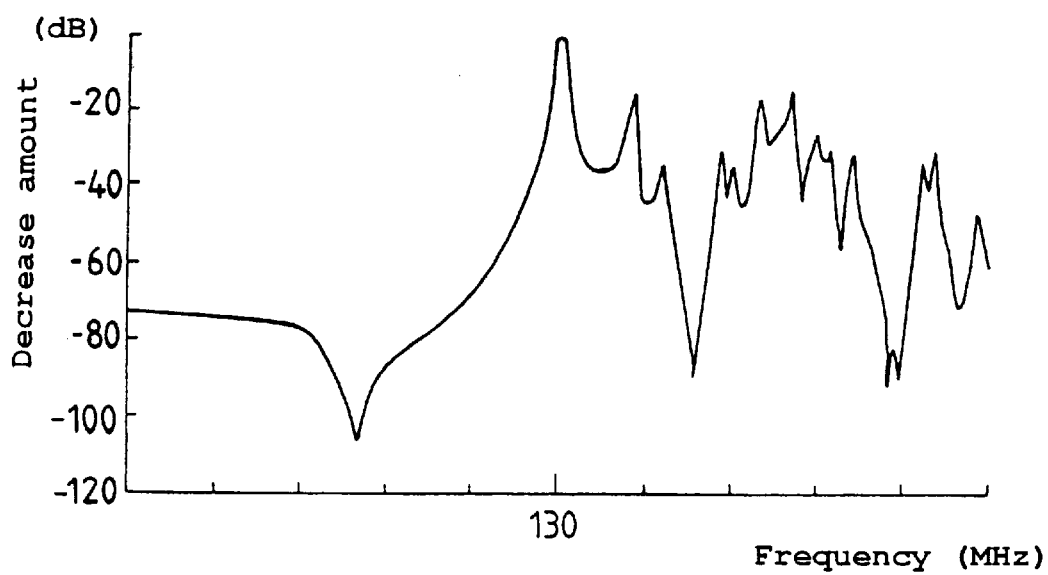
FIG. 13 is a graph showing a frequency characteristic of the;fifth embodiment as shown in FIG. 8.

A monolithic crystal filter employed for the fifth embodiment is a rectangular shaped AT cut quartz plate, being 2.5 mm by 5, having a center frequency thereof predetermined at 130 MHz, and has an arrangement wherein a pair of rectangular electrodes having longer sides of 0.78 mm, shorter sides of 0.56 mm are formed on the back side at an interval of 0.1 mm between the electrodes, and a rectangular common electrode 43 having longer sides of 1.84 mm and shorter sides of 1.1 mm is formed on the surface so as to cover the input and output electrodes. As a frequency characteristic in the monolithic crystal filter of the above arrangement is shown in FIG. 13, compared with FIG. 22 showing a frequency characteristic in the monolithic crystal filter of the piror art, it is obvious that the spurious vibration of the non-harmonic overtone mode or the like, having conventionally relatively greater vibration energy, is damped. Also, the above case, in the same way as the device according to the first embodiment illustrated in FIG. 12, has a characteristic wherein the pass band width is greater than that of the conventional product though it is difficult to recognize the fact from FIG. 13.

Figure 14:
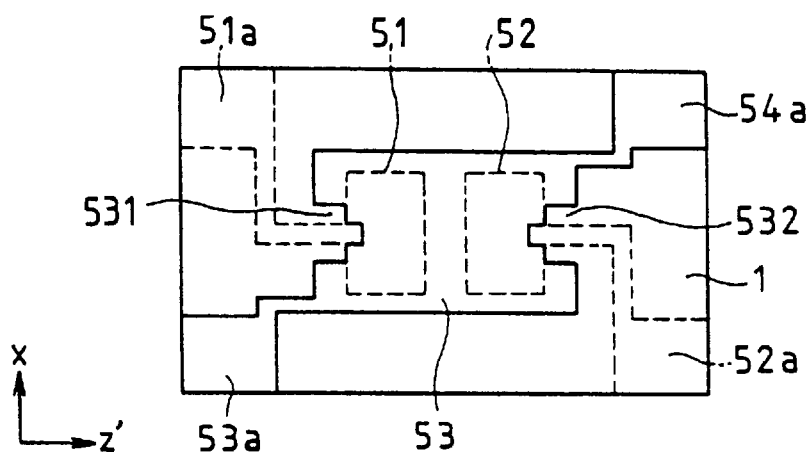
FIG. 14 is a plan view showing a principal plane having a common electrode in a modification of the fifth embodiment according to the present invention.

As a modification of the fifth embodiment, there is a structure shown in FIG. 14. According to the modification, a rectangular common electrode 53 formed on one principal plane has four sides being longer than those of a rectangular input electrode 51 and a rectangular output electrode 52 formed on the other principal plane so as to cover the both of the input electrode 51 and the output electrode 52, and the depth of the each notch 531, 532 reaches the common electrode 53 opposite to the input and output electrodes 51, 52 formed on the back side, whereby the structure of the modification is equivalent to that shown in FIG. 8 in the above points, on the other hand, a shape of the each notch in the modification is different from that in FIG. 8. The common electrode 53 is led to each corner positioned on each diagonal line of the quartz plate 1 by outgoing electrodes 53a, 54a to be connected to a grounding terminal (not shown) Moreover, the input electrode 51 and the output electrode 52 are led to each corner positioned on a diagonal line of the quartz plate 1 by outgoing electrodes 51a, 52a.

Figure 15:
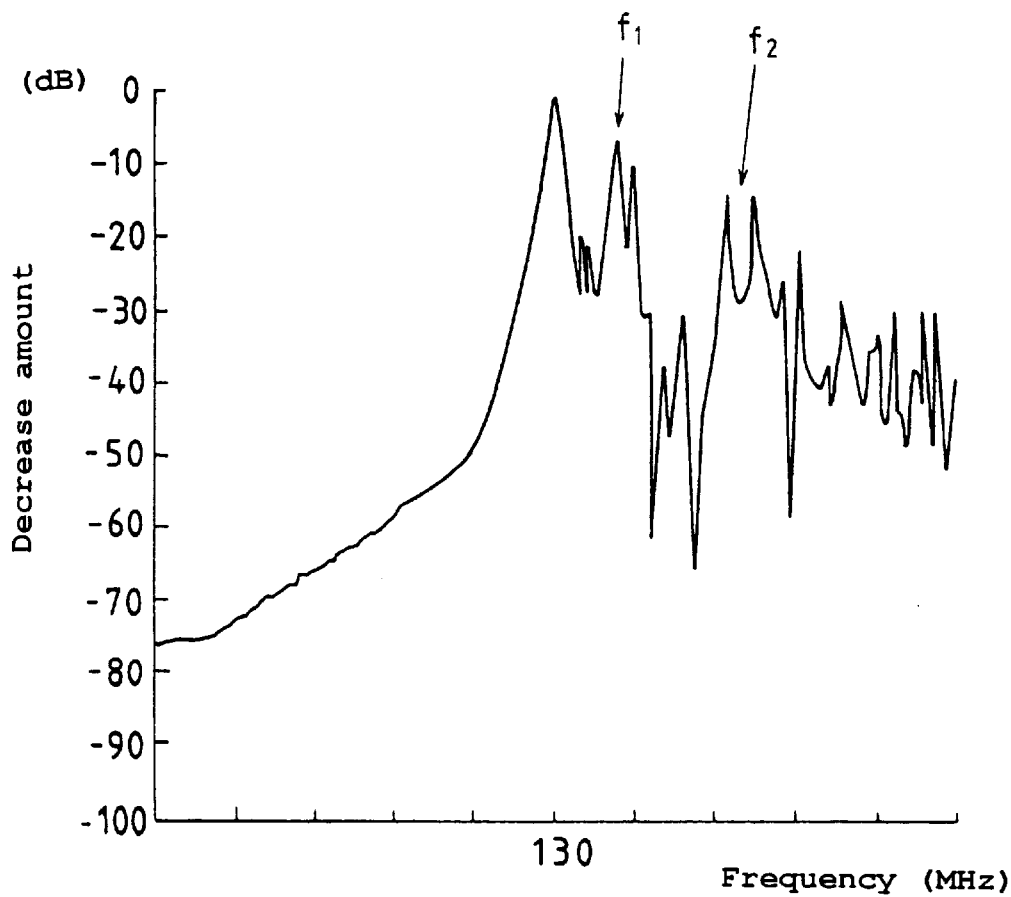
FIG. 15 is a graph showing a frequency characteristic of a modification of the fifth embodiment as shown in FIG. 14.

A frequency characteristic of the monolithic crystal filter having the structure is shown in FIG. 15, compared with FIG. 22 showing a frequency characteristic in the monolithic crystal filter of the prior art, in the same way as the above mentioned structure in FIG. 8, it is obvious that the spurious vibration of the non-harmonic overtone mode or the like, having conventionally the relatively greater vibration energy, is damped, and it is recognized that the spurious vibration in (f1) and (f2) is far from the principal vibration, thus recognizing the fact of damping the spurious vibration (f2)

Figure 16:
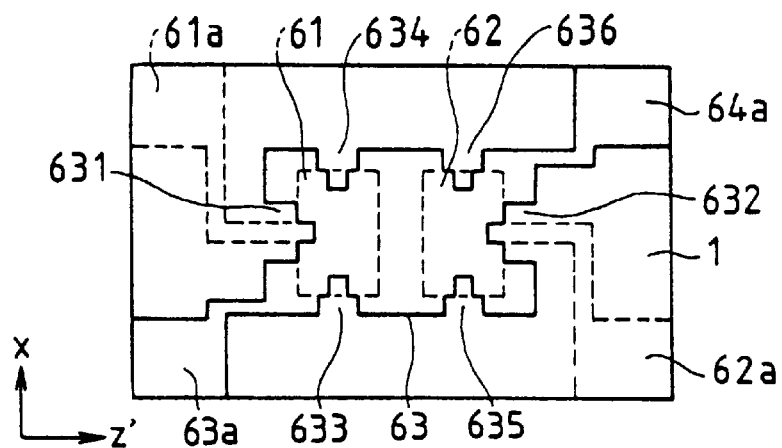
FIG. 16 is a plan view showing a principal plane having a common electrode in a sixth embodiment according to the present invention.

Next, a sixth embodiment is described as below, referring to FIG. 16. FIG. 16 is a plan view of a principal plane having the common electrode.

According to the embodiment, notches 631, 632 formed on an input electrode 61, an output electrode 62 and a common electrode 63 so as to face to each other in a Z'-axis direction are structurally equivalent to those in the modification shown in FIG. 14. On the other hand, it is structurally characterized in that notches 633, 634, 635, 636 are formed on the common electrode 63 in an X-axis direction. The notches 633 and 634, and 635 and 636 are respectively formed so as to face to each other.

Figure 17:
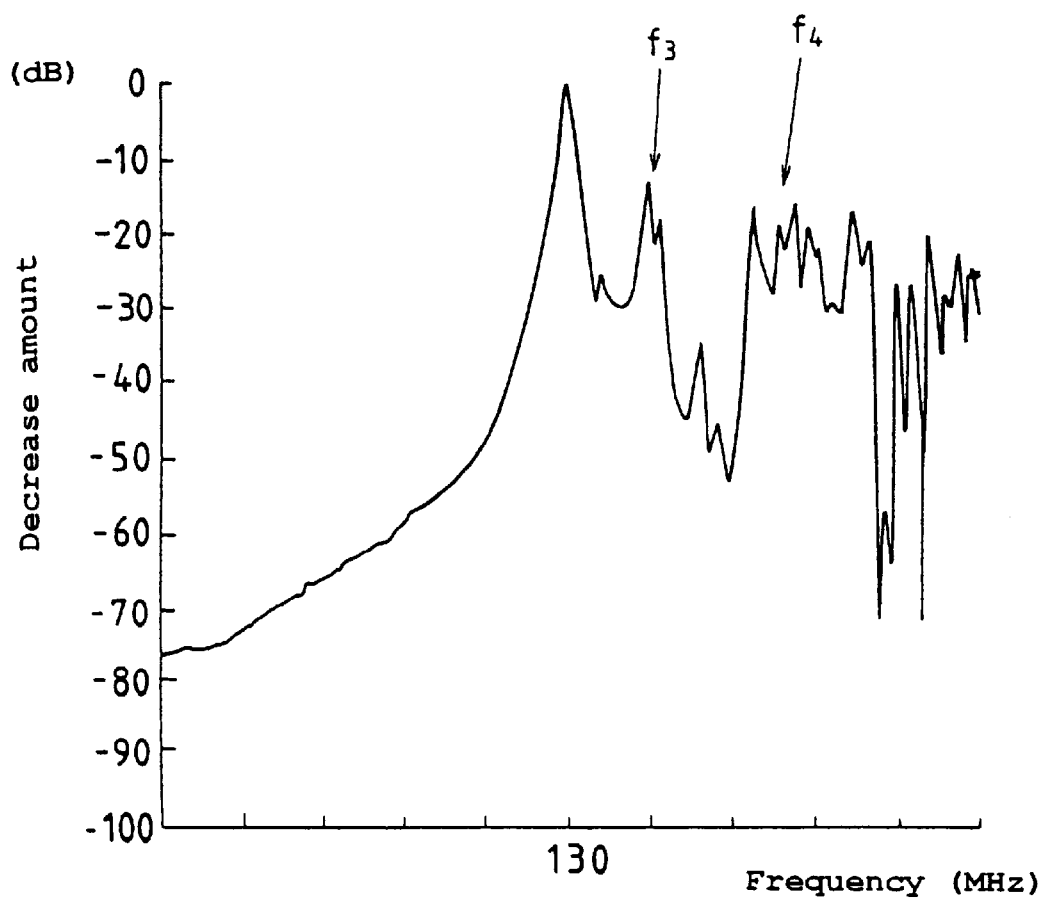
FIG. 17 is a graph showing a frequency characteristic of the sixth embodiment as shown in FIG. 16.

The frequency characteristic of the monolithic crystal filter is shown in FIG. 17. In the same way as FIG. 15 illustrating the frequency characteristic by means of the arrangement shown in FIG. 8 mentioned above, the spurious vibrations in (f3) and (f4) are far from the principal vibration and in the sixth embodiment, it is recognized that not only the spurious vibration in (f3) but also that in (f4) are damped.

Figure 18:
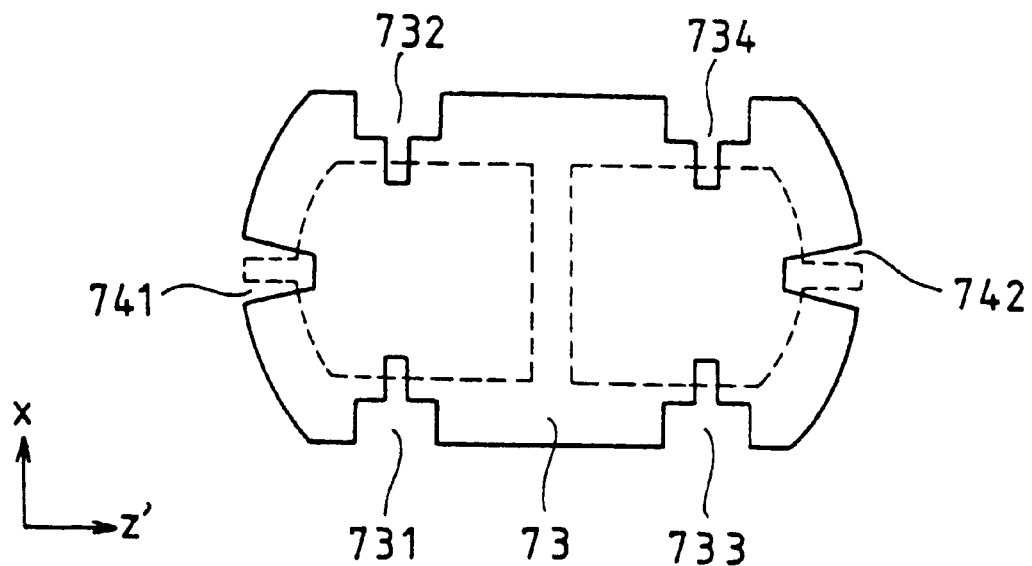
FIG. 18 is a plan view showing a principal plane having a common electrode in a modification of the sixth embodiment according to the present invention.
Figure 19:
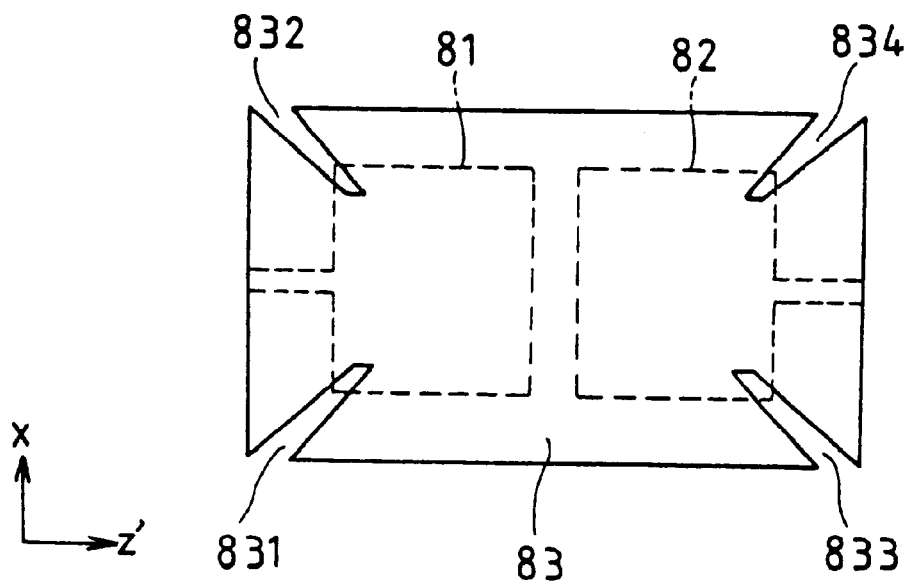
FIG. 19 is a graph showing a frequency characteristic in a modification of the sixth embodiment as shown in FIG. 18.

Moreover, as a modification of the sixth embodiment, structures in FIGS. 18 and 19 can be cited. In an arrangement of the FIG. 18, shapes and forming positions of notches 731, 732, 733, 734 formed on a common electrode 73 in an X-axis direction are structurally equivalent to those in FIG. 16. Though shapes of notches 741 and 742 formed in a Z'-axis direction are different from those in FIG. 16, forming portions thereof are corresponding to those in FIG. 16. Shorter sides opposite to the common electrode 73 are formed outwardly in an arc shape. The arrangement has the same effect as that in FIG. 16.

In an arrangement shown in FIG. 19, a common electrode 83 is provided with notches 831, 832, 833, 834 which reach the common electrode 83 opposite to an input electrode 81 and an output electrode 82, along each diagonal line drawn from each corner of the rectangular electrode. Also, the arrangement has the same effect as that in FIG. 16.

In the above mentioned fifth and sixth embodiments, the common electrode may have a structure wherein only two sides opposite to each other may be longer than those of the input and output electrodes, or the common electrode may be formed on a whole surface of the quartz plate. However, in case of connecting the quartz plate to an electrode pad of a package by a conductive connection material or the like, there is a possibility of causing a short circuit between the outgoing electrodes of the input and output electrodes formed on the other principal plane and the electrode pad with the result that an electrodeless area must be formed in order to prevent the problem from happening in case of employing the arrangement.

Figure 11:
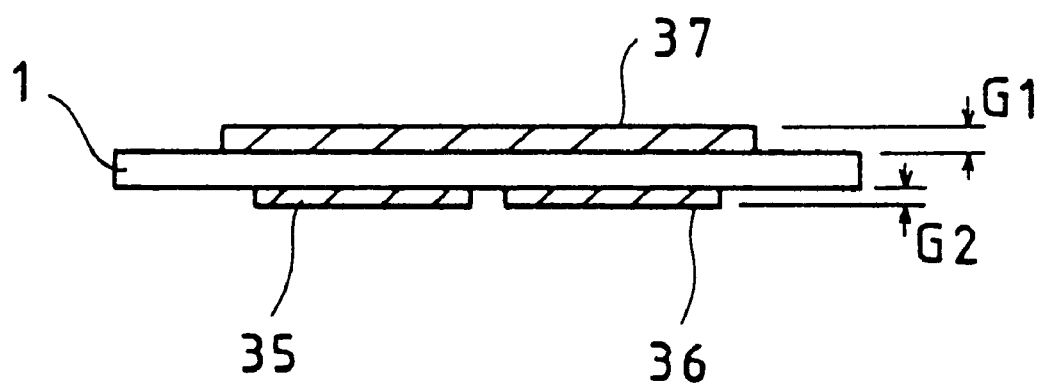
FIG. 11 is a diagram showing a thickness of each electrode, applicable for each embodiment according to the present invention.

In the each embodiment, either the input electrode and the output electrode on one principal plane or the common electrode on the other principal plane may be formed thickly, for example, as shown in FIG. 11, a thickness G1 of the common electrode 37 is greater than a thickness G2 of the input electrode 35 or the output electrode 36. Preferably, the thickness G1 is four times thickness G2, in order to emit the spurious vibration energy outwardly. With the thickness is increased, the band is increased. However, after an increment reaches a certain limit, the further increment fails to increase the band much more. The device must be designed, taking the above fact into consideration. By such an arrangement, changes of boundary condition owing to reducing or adding a weight is further emphasized, thus being capable of restraining the spurious vibration.

In the each embodiment mentioned above, preferably, the common electrode formed on one principal plane of the quartz plate is twice to 10 times as thick as the input electrode and the output electrode formed on the other principal plane in order to emit the spurious vibration energy outwardly. For example, as shown in FIG. 11, the thickness of the common electrode 37 is approximately twice the thickness G2 of the input electrode 35 and the output electrode 36. The limitation of scope between twice and 10 times is designed, in consideration of the fact wherein the band is increased with the thickness is increased, but, after the increment reaches a certain limit, the further increment fails to increase the band much more. Referring to experimental data illustrated in FIGS. 24 and 25, it is described as below.

Figure 24:
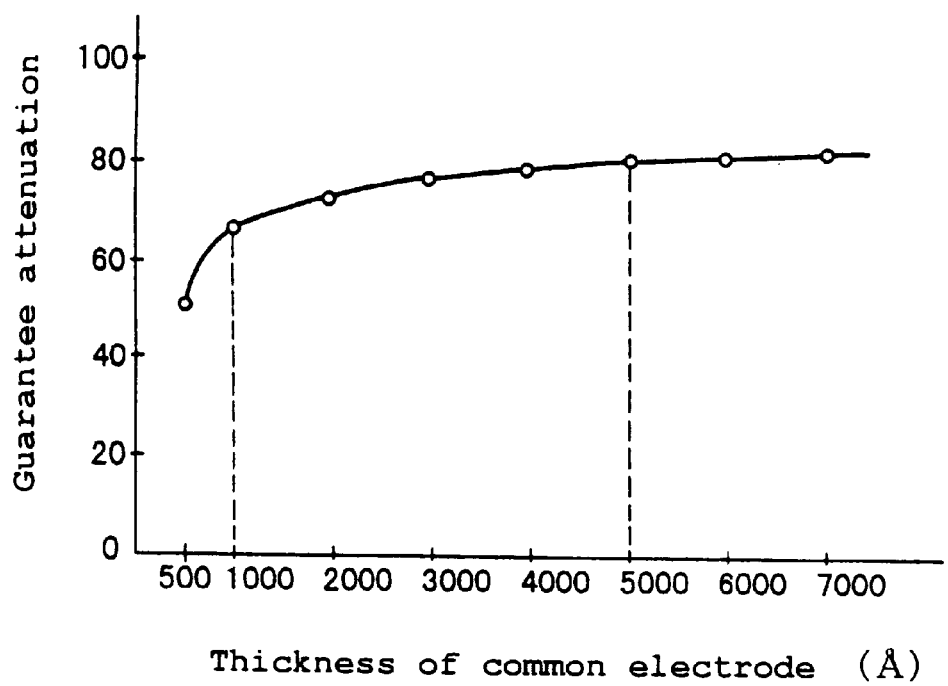
FIG. 24 is a graph showing a guarantee attenuation characteristic to the thickness of the common electrode under a condition wherein the electrode material is a multiple-layer structure of chrome-silver-chrome, a thickness of a split electrode is 500 Å, and a principal vibration frequency is 130 MHz.
Figure 25:
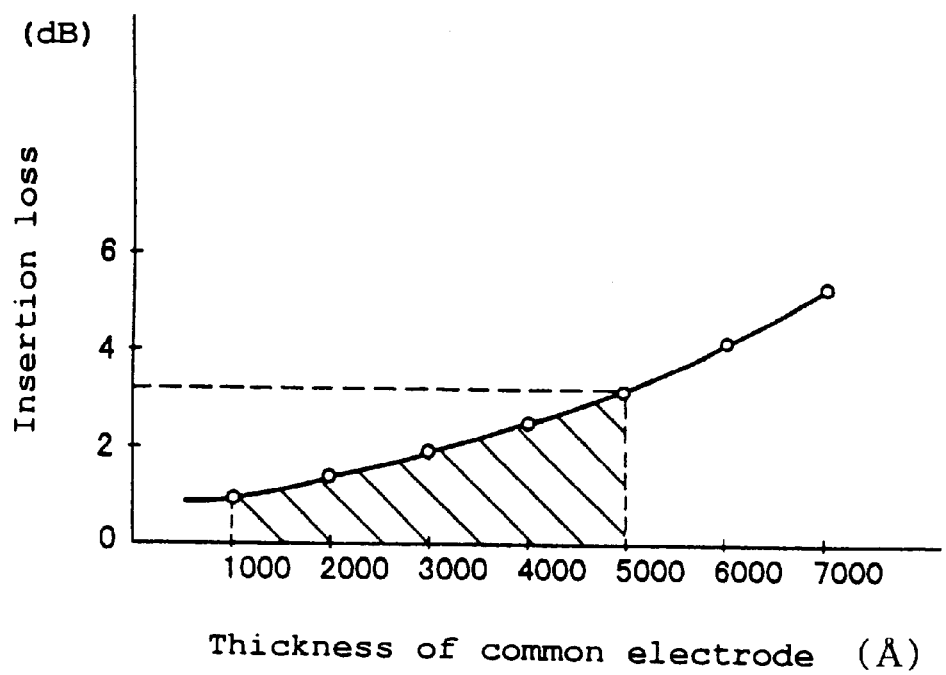
FIG. 25 is a graph showing an insertion loss characteristic to the thickness of the common electrode under a condition wherein the electrode material is the multiple-layer structure of chrome-silver-chrome, the thickness of a split electrode is 500 Å, and the principal vibration frequency is 130 MHz.
Figure 26:
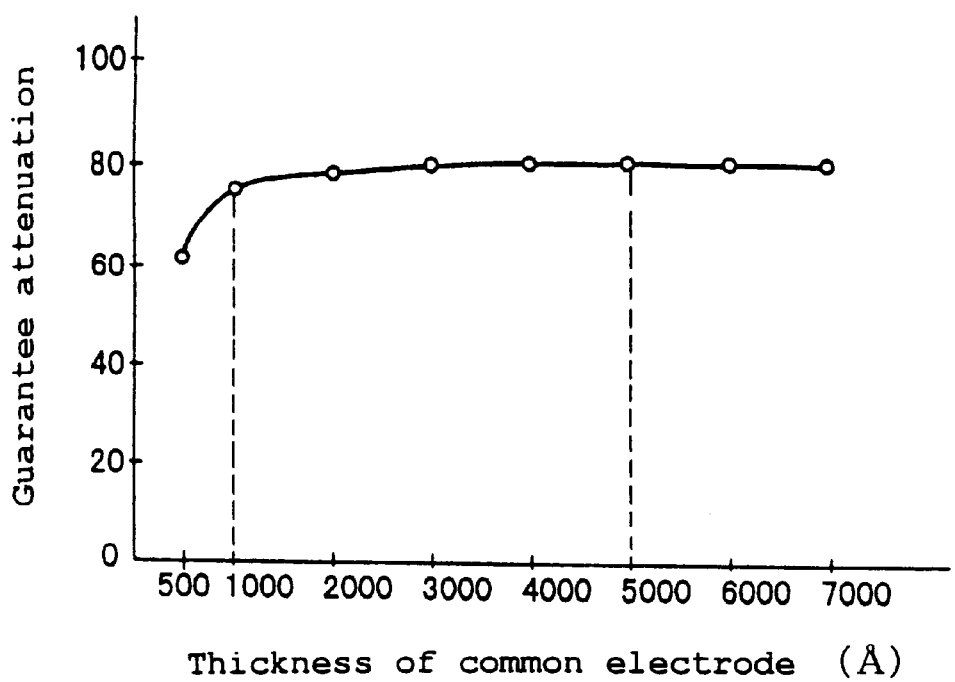
FIG. 26 is a graph showing a guarantee attenuation characteristic to the thickness of the common electrode under a condition wherein the electrode material is the multiple-layer structure of chrome-silver-chrome, the thickness of the split electrode is 500 Å, and the principal vibration frequency is 45 MHz.
Figure 27:
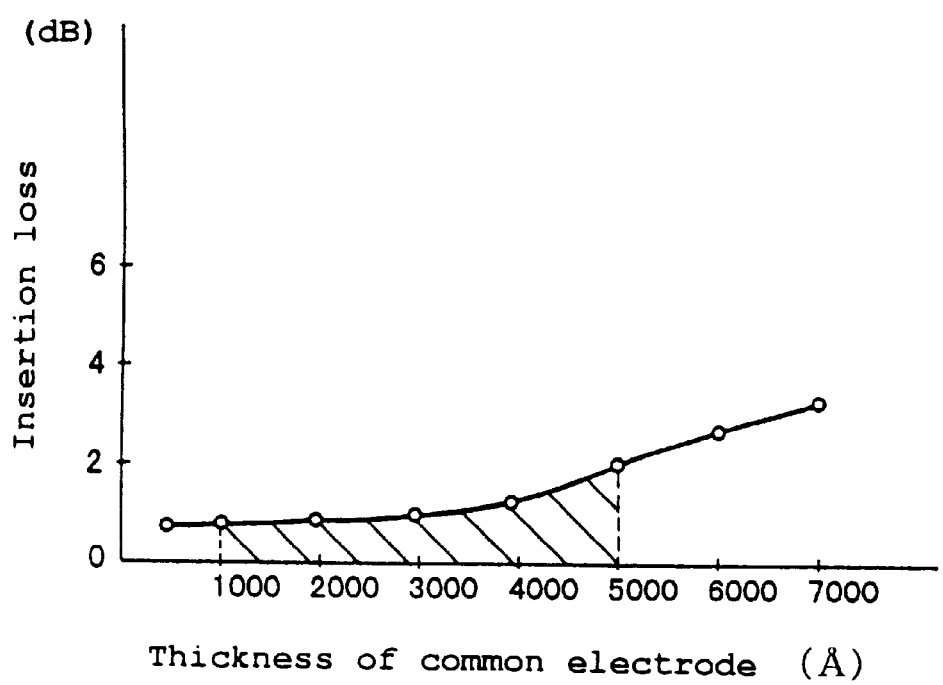
FIG. 27 is a graph showing an insertion loss characteristic to the thickness of the common electrode under a condition wherein the electrode material is the multiple-layer structure of chrome-silver-chrome, the thickness of the split electrode is 500 Å, and the principal vibration frequency is 45 MHz.

FIG. 24 shows each guarantee attenuation in case that a multiple-layer structure of chrome-silver-chrome is employed as an electrode material, the thickness of the input electrode and the output electrode is 500 Å and the frequency of the principal vibration is 130 MHz, and the thickness of the common electrode is changed as below: that is 500 Å, 1000 Å, 2000 Å, 3000 Å, 4000 Å, 5000 Å, 6000 Å, and 7000 Å. FIG. 25 is a graph for illustrating insertion loss to the each thickness of the common electrode. Moreover, FIG. 26 shows each guarantee attenuation in case that the multiple-layer structure of chrome-silver-chrome is employed as an electrode material, the thickness of the input electrode and the output electrode is 500 Å and the frequency of the principal vibration is 45 MHz, and the thickness of the common electrode is changed as below: that is 500 Å, 1000 Å, 2000 Å, 3000 Å, 4000 Å, 5000 Å, 6000 Å, and 7000 Å. FIG. 27 is a graph for illustrating the insertion loss to the each thickness of the common electrode.

In case that the frequency of the principal vibration is 130 MHz, the insertion loss tends to be higher as shown in FIG. 25, whereby the insertion loss less than approximately 3 dB comes within the employable scope. In case that a frequency of the fundamental wave is 45 MHz, the insertion loss tends to be lower, whereby the insertion loss less than approximately 2 dB comes within the employable scope. Furthermore, taking the most appropriate value of the guarantee attenuation characteristics into consideration, in the above both cases, the best range of the thickness of the common electrode is from 1000 Å to 5000 Å. The above data support the scope of the thickness of the common electrode which is experimentally predetermined at twice to tenfold the thickness of the input and output electrodes.

By the structure mentioned above, better guarantee attenuation characteristics are obtained, changes of the boundary condition by reducing or adding a weight are more emphasized with the result that the spurious vibration can be effectively restrained.

The spurious restraining effect is different according to a size (an amount) of a weight reducing portion or a weight adding portion so that there are some cases wherein the principal vibration mode is damped. Moreover, the notches must be designed, taking a production error in forming the electrode, into consideration.

Figure 21:
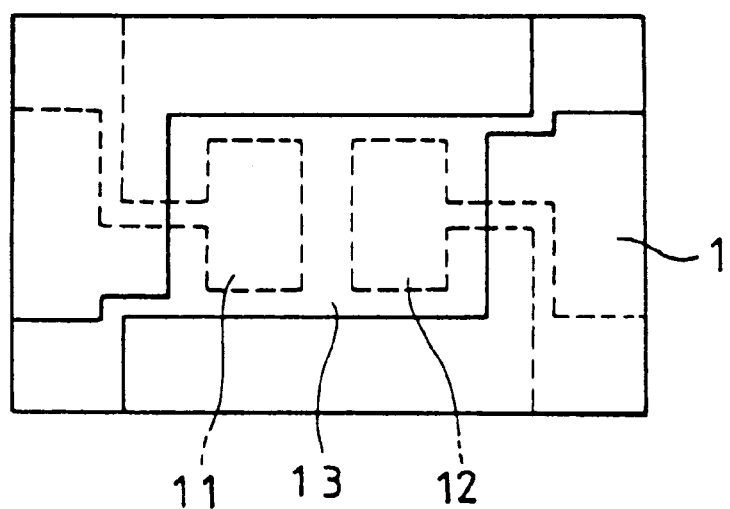
FIG. 21 is a plan view of a principal plane having a common electrode, for illustrating an electrode structure of a piezoelectric vibration device employable for obtaining the frequency characteristic generated by an electrode material.
Figure 23:
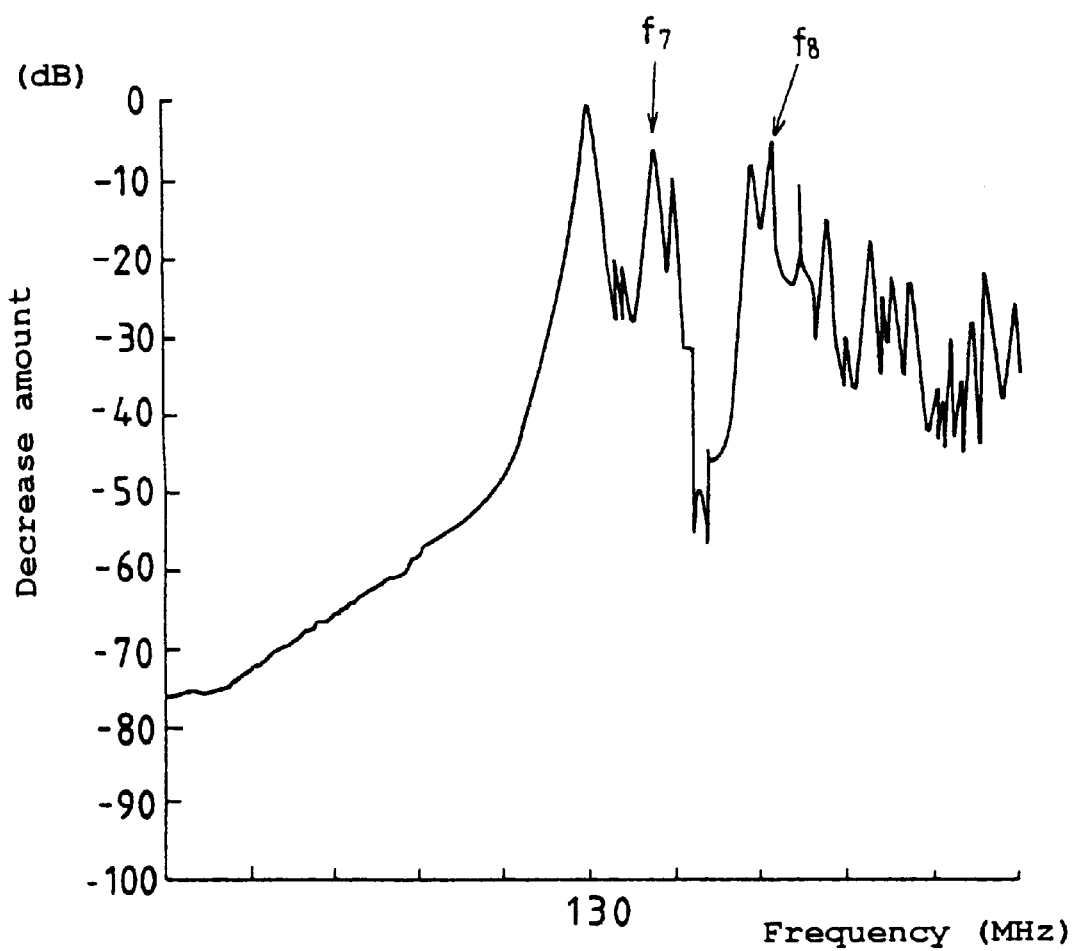
FIG. 23 is a graph showing a frequency characteristic under a condition wherein the electrode material is silver in the electrode structure as shown in FIG. 21.

The multiple-layer structure of chrome-silver-chrome is employed as an electrode material, in the above embodiments. Compared with a conventional case of employing aluminium as the electrode material, it is advantageous that the spurious vibration can be generated farther from the principal vibration. FIGS. 22 and 23 show frequency characteristics in case that the structure shown in FIG. 21 is applied to the electrodes and aluminium and silver are respectively employed as the electrode material. Though neither the common electrode 13, the input electrode 11, nor the output electrode 12 has a structure for reducing or adding a weight, which is a characteristic structure of the present invention, only differences of action and effect obtained by difference of the electrode material are described. As shown in FIG. 22, in case of employing an aluminium electrode, the spurious vibrations (f5), (f6) are greatly generated in the peripheral zone of the principal vibration, but on the other hand, in case of employing a silver electrode, the spurious vibrations (f7), (f8) are generated far from the principal vibration. This is grounded on the reasons as below. First, in case that the spurious vibration being a thickness-shear non-harmonic vibration is formed by a heavy electrode in relative density, a decrement of the frequency of the non-harmonic vibration is smaller than that of the frequency of the principal vibration, with the result that, seemingly, the frequency of the spurious vibration is higher than that of the principal vibration. Second, it is owing to the additional reasons wherein aluminium is liable to oxidize, and it is a more unstable material compared with silver. Under the above description, employing silver as the electrode material is effective means in view of restraining the influences of the spurious vibration. Furthermore, employing gold instead of silver as the electrode material is also allowed. In addition, the electrode material is not limited to only gold and silver, and metal multiple structure mainly composed of gold or silver including three layer structures such as chrome-silver-gold, chrome-silver-chrome, chrome-gold-chrome, nickel-silver-nickel, chrome-silver-nickel or nickel-silver-chrome, and double layer structures or electrode structures such as chrome-silver, chrome-gold, nickel-silver, nickel-gold or the like. Also in case of employing these electrodes, the same effect as obtained in case of employing only silver can be obtained.

Figure 30:
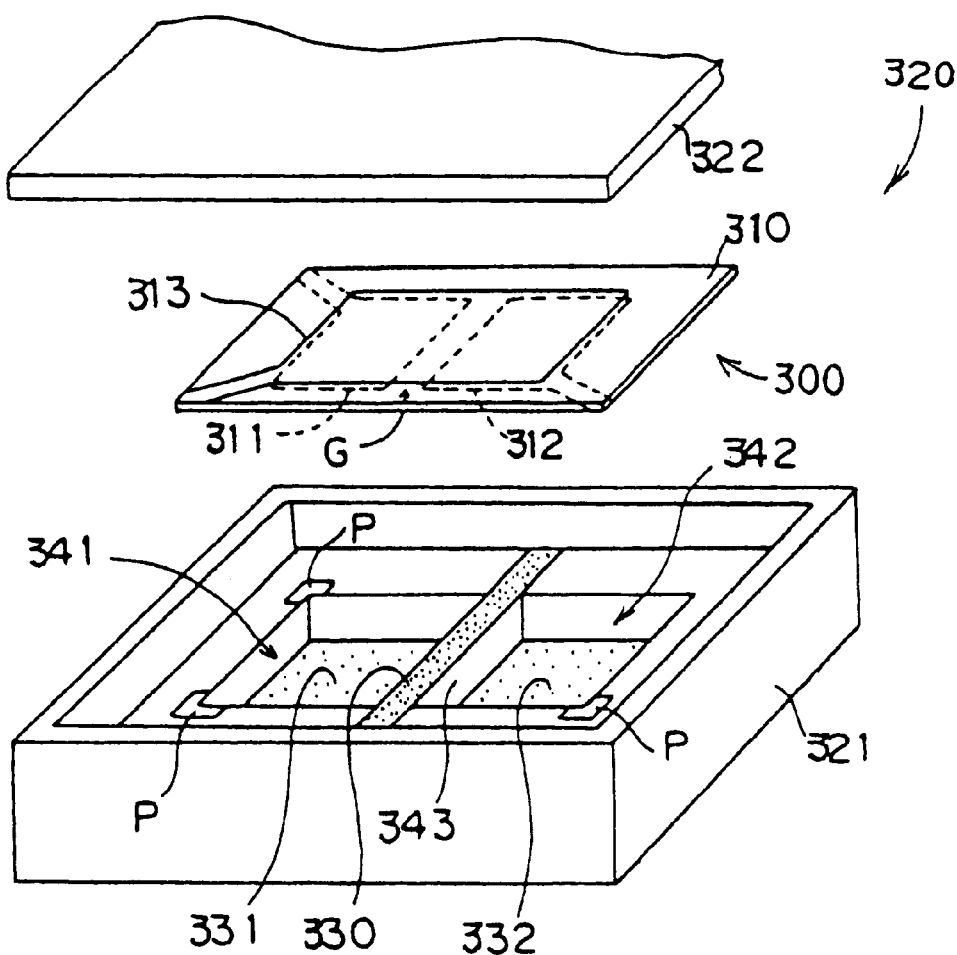
FIG. 30 is an exploded perspective view of a package employed for a measurement of a frequency characteristic of the piezoelectric vibration device.

The frequency characteristics shown in FIGS. 12, 13, 15, 17, 22 and 23 are measured by means of package 320 illustrated in an exploded perspective view of FIG. 30. The piezoelectric vibration device 300 to be measured may be any of the devices according to the present invention. For example, as shown in FIG. 30, on a plane of a piezoelectric substrate 310, a pair of input and output vibration electrodes 311, 312 are formed so as to have a predetermined gap G intervening therebetween, and on the other plane, a common electrode 313 is formed so as to face thereto, the piezoelectric vibration device 300 is housed inside a surface-mounting-type package 320.

The package 320 comprises a package body 321 composed of an insulating material such as ceramics, and a metallic lid 322 for covering an upper surface opening of the package body 321 via Kovarring (not shown). The package body 321 is provided with two pits 341, 342 respectively opposed to the input vibration electrode 311 and the output vibration electrode 312 on the piezoelectric substrate 310 respectively in an assembling state, and a partition 343 between the respective pits 341 and 342 is disposed along the gap G intervening between the pair of input and output vibration electrodes 311, 312.

In the piezoelectric vibration device 300, the pair of input and output vibration electrodes 311 and 312 facing each bottom of pits 341, 432, are supported by the package body 321 in the peripheral zone of the pits 341, 342 at three corners of the piezoelectric substrate 310. The pair of input and output vibration electrode 311, 312 and the common electrode 313 are respectively led to three corners of the piezoelectric substrate 310 by outgoing electrodes respectively corresponding thereto, and the package body 321 is provided with three connecting pads P at the positions corresponding to the corners in the peripheral zone of the pits 341, 342. The piezoelectric substrate 310 is automatically secured on the connecting pads P in a state wherein the conductive adhesive does not prevent the piezoelectric substrate 310 from vibrating at three corners, at the same time when the pair of input and output vibration electrodes 311, 312 and the common electrode 313 are electrically connected to the respective connecting pads P. Under such a condition, the measurement is performed.

In the first to the sixth embodiments mentioned as above, though the two-pole-type electrode structure has been described, the embodiments are also applied to the three-pole-type or four-pole-type piezoelectric vibration device, in the same way. The embodiments are described, referring to FIGS. 28 and 29.

Figure 28:
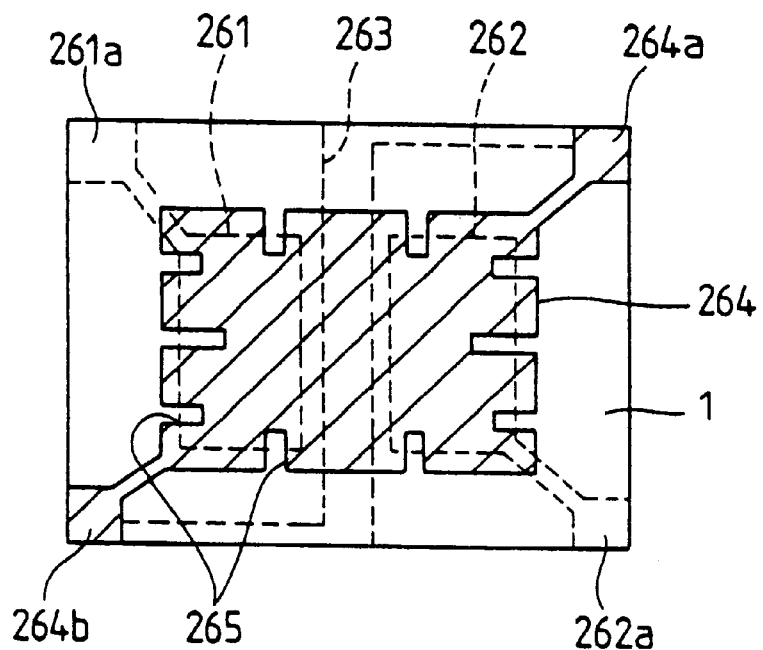
FIG. 28 is a plan view showing a principal plane having a common electrode in a seventh embodiment according to the present invention.

FIG. 28 is a plan view of a principal plane having a common electrode in a seventh embodiment, for illustrating a three-pole-type piezoelectric vibration device.

As a quartz plate 1, an AT cut quartz plate to be worked rectangularly is employed, on one principal plane, a rectangular input electrode 261, a grounding electrode 263, an output electrode 262 are formed at predetermined intervals in a state wherein the grounding electrode 263 intervenes between the input electrode 261 and the output electrode 262. The input electrode 261 and the output electrode 262 are led to each corner positioned on a diagonal line of the quartz plate 1 by outgoing electrodes 261a, 262a, and the grounding electrode 263 is led to each corner positioned on another diagonal line thereof by outgoing electrodes (not shown). On the other hand, on the other principal plane, a common electrode 264 is formed opposite to the input electrode 261, the grounding electrode 263 and the output electrode 262, and the common electrode 264 is led to each corner positioned on a diagonal line of the quartz plate 1 by outgoing electrodes 264a, 264b, to be connected to the grounding electrode 263 in common. At the periphery of the common electrode 264, notches 265 are formed at a depth wherein the notches can reach the input electrode 261 and the output electrode 262 opposed thereto. In the three-pole-type piezoelectric vibration device, the common electrode 264 is provided with a weight reducing portion, thus losing the balance of the spurious vibration and weakening the vibration energy of the spurious vibration as a whole.

Figure 29:
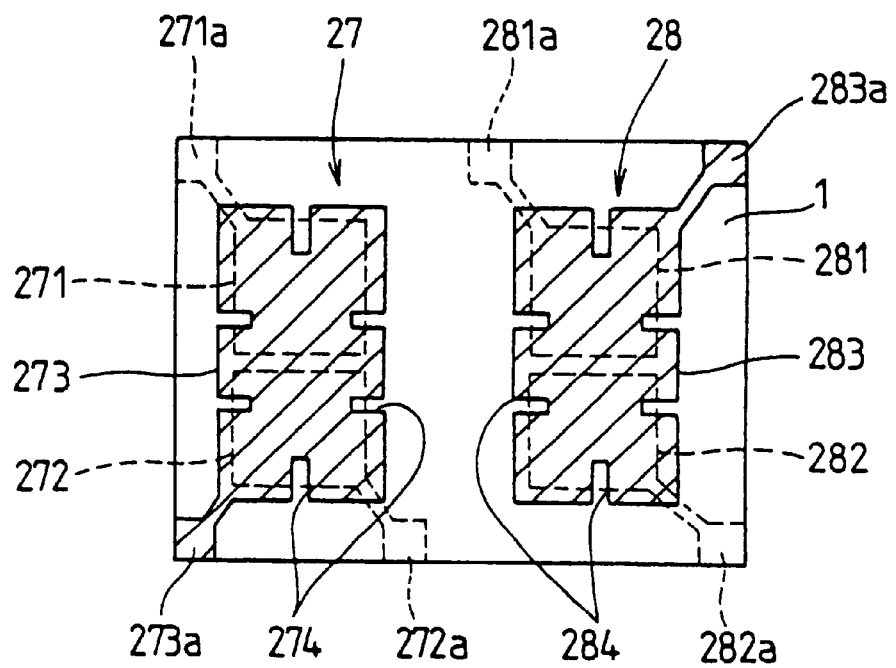
FIG. 29 is a plan view showing a principal plane having a common electrode in an eighth embodiment according to the present invention.

FIG. 29 is a plan view of a principal plane having a common electrode in an eighth embodiment, for illustrating a four-pole-type piezoelectric vibration device.

As a quartz plate 1, an AT cut quartz plate to be worked rectangularly is employed, on one principal plane, two pairs of input and output electrodes, or a rectangular input electrode 271 and a rectangular output electrode 272, a rectangular input electrode 281 and a rectangular output electrode 282 are respectively formed at predetermined intervals. The input electrode 271 and the output electrode 272, and the input electrode 281 and the output electrode 282 are respectively led to each corner of the quartz plate 1 by outgoing electrodes 271a, 272a, 281a, and 282a. On the other hand, on the other principal plane, common electrodes 273, 283 are formed respectively so as to be opposed to the input electrode 271 and the output electrode 272, and the input electrode 281 and the output electrode 282, and the common electrodes 273, 283 are led to each corner positioned on each diagonal line of the quartz plate 1 by outgoing electrodes 273a, 283a. At the periphery of the common electrodes 273, 283, respective notches 274, 284 are formed at each depth wherein the each notch can reach the input electrode 271 and the output electrode 272, and the input electrode 281 and the output electrode 282 opposed thereto. In the four-pole-type piezoelectric vibration device, the common electrodes 274, 284 are respectively provided with weight reducing portions, thus losing the balance of the spurious vibration and weakening the vibration energy of the spurious vibration as a whole.

INDUSTRIAL APPLICABILITY

As mentioned above, according to the present invention, the piezoelectric vibration device utilizing a thickness-shear vibration available for communication devices or the like, is effective as a reliable device by making it possible to restrain influences by a spurious vibration, and enhance guarantee attenuation characteristics.

What is claimed is:

1. A piezoelectric vibration device utilizing a thickness-shear vibration having a resonant area formed by an input electrode, an output electrode and a common electrode, the piezoelectric vibration device comprising:

a quartz plate having a pair of principal planes, the input electrode and the output electrode disposed on a principal plane of the quartz plate, the input electrode and the output electrode formed close to each other at a regular interval, the common electrode disposed on the other principal plane of the quartz plate, corresponding to the input electrode and the output electrode, and a weight reducing notch disposed on each of peripheral zones of the input electrode, the output electrode, and the common electrode, and wherein the weight reducing notch is disposed on the peripheral zones where a vibrational energy of a spurious vibration, generated in excitation of the piezoelectric vibration device, is relatively greater than that of a principal vibration.

2. A piezoelectric vibration device according to claim 1, wherein the each electrode is formed to be rectangular, and the weight reducing notch is disposed on one center of the far sides where the input electrode and the output electrode are opposite to each other as well as one center of the far sides opposite to the common electrode.

3. A piezoelectric vibration device according to claim 1, wherein an area of the common electrode is formed to be larger than a total area of the input electrode and the output electrode, and the peripheral zone of the common electrode is at least partially provided with the weight reducing notch reaches the common electrode opposite to the input electrode and the output electrode.

4. A piezoelectric vibration device according to claim 1, wherein the electrode formed on one principal plane of the quartz plate is thickly formed.

5. A piezoelectric vibration device according to claim 1, wherein the common electrode formed on one principal plane of the quartz plate is twice to 10 times as thick as the input electrode and the output electrode formed on the other principal plane.

6. A piezoelectric vibration device according to claim 1, wherein the electrode formed on one principal plane of the quartz plate is made of gold, silver or a metal material mainly composed of gold or silver.

7. A piezoelectric vibration device utilizing a thickness-shear vibration having a resonant area formed by an input electrode, an output electrode, a grounding electrode and a common electrode, the piezoelectric vibration device comprising:

a quartz plate having a pair of principal planes, the input electrode and the output electrode disposed on a principal plane of the quartz plate, the grounding electrode interposed between the electrodes, in which the input electrode, the output electrode and the grounding electrode are respectively formed close to each other at regular intervals, the common electrode disposed on the other principal plane of the quartz plate, corresponding to the input electrode, the output electrode, and the grounding electrode, and a weight reducing notch disposed on each of peripheral zones of the input electrode, the output electrode, and the common electrode, and wherein the weight reducing notch is disposed on the peripheral zones where a vibrational energy of a spurious vibration, generated in excitation of the piezoelectric vibration device, is relatively greater than that of a principal vibration.

8. A piezoelectric vibration device according to claim 7, wherein the weight reducing notch disposed on the electrodes on a principal plane reaches an area opposite and corresponding to the electrodes on the other principal plane.

9. A piezoelectric vibration device according to claim 8, wherein an area of the common electrode is formed to be larger than a total area of the input electrode and the output electrode, and the peripheral zone of the common electrode is at least partially provided with the weight reducing notch reaches the common electrode opposite to the input electrode and the output electrode.

10. A piezoelectric vibration device according to claim 8, wherein the electrode formed on one principal plane of the quartz plate is thickly formed.

11. A piezoelectric vibration device according to claim 8, wherein the common electrode formed on one principal plane of the quartz plate is twice to 10 times as thick as the input electrode and the output electrode formed on the other principal plane.

12. A piezoelectric vibration device according to claim 8, wherein the each electrode is formed to be rectangular, and the weight reducing notch is disposed on one center of the far sides where the input electrode and the output electrode are opposite to each other as well as one center of the far sides opposite to the common electrode.

13. A piezoelectric vibration device utilizing a thickness-shear vibration having resonant areas formed by two pairs of input and output electrodes and common electrodes, the piezoelectric vibration device comprising:

a quartz plate having a pair of principal planes, the two pairs of input and output electrodes respectively including an input electrode and an output electrode, disposed on a principal plane of the quartz plate in parallel, in which the input electrode and the output electrode are formed close to each other at a regular interval, the common electrodes disposed on the other principal plane of the quartz plate, corresponding to the respective pairs of input and output electrodes, and a weight reducing notch disposed on each of peripheral zones of the input electrode, the output electrode, and the common electrode, and wherein the weight reducing notch is disposed on the peripheral zones where a vibrational energy of a spurious vibration, generated in excitation of the piezoelectric vibration device, is relatively greater than that of a principal vibration.

14. A piezoelectric vibration device according to claim 13, wherein the weight reducing notch disposed on the electrodes on a principal plane reaches an area opposite and corresponding to the electrodes on the other principal plane.

15. A piezoelectric vibration device according to claim 14, wherein an area of the common electrode is formed to be larger than a total area of the input electrode and the output electrode, and the peripheral zone of the common electrode is at least partially provided with the weight reducing notch reaches the common electrode opposite to the input electrode and the output electrode.

16. A piezoelectric vibration device according to claim 14, wherein the electrode formed on one principal plane of the quartz plate is thickly formed.

17. A piezoelectric vibration device according to claim 14, wherein the common electrode formed on one principal plane of the quartz plate is twice to 10 times as thick as the input electrode and the output electrode formed on the other principal plane.

18. A piezoelectric vibration device according to claim 14, wherein the electrode formed on one principal plane of the quartz plate is made of gold, silver or a metal material mainly composed of gold or silver.

19. A piezoelectric vibration device according to claim 1, wherein the weight reducing notch disposed on the electrodes on a principal plane reaches an area opposite and corresponding to the electrodes on the other principal plane.

20. A piezoelectric vibration device according to claim 8, wherein the electrode formed on one principal plane of the quartz plate is made of gold, silver or a metal material mainly composed of gold or silver.

21. A piezoelectric vibration device according to claim 14, wherein the each electrode is formed to be rectangular, and the weight reducing notch is disposed on one center of the far sides where the input electrode and the output electrode are opposite to each other as well as one center of the far sides opposite to the common electrode.

22. A method of restraining a vibrational energy of a spurious vibration generated in excitation of a piezoelectric vibration device, comprising the steps of:

providing a quartz plate having a pair of principal planes, an input electrode and an output electrode on a principal plane of the quartz plate, the input electrode and the output electrode forming close to each other at a regular interval, and a common electrodes on the other principal plane of the quartz plate, corresponding to the input electrode and the output electrode, and notching peripheral zones of each of the input electrode, the output electrode, and the common electrode, to restrain a vibrational energy of a spurious vibration generated in excitation of a piezoelectric vibration device.

23. The method of restraining a vibrational energy of a spurious vibration generated in excitation of a piezoelectric vibration device of claim 22, wherein said notching step further comprises:

notching on a portion where the vibrational energy of the spurious vibration, generated in excitation of the piezoelectric vibration device, is relatively greater than that of a principal vibration.

24. The method of restraining a vibrational energy of a spurious vibration generated in excitation of a piezoelectric vibration device of claim 22, wherein said providing step comprises providing:

each electrode in the form of rectangular shape, and said notching step comprises notching on one center of the far side where the input electrode and the output electrode are opposite to each other as well as on one center of the far side opposite to the common electrode.

25. The method of restraining a vibrational energy of a spurious vibration generated in excitation of a piezoelectric vibration device of claim 22, wherein said providing step comprises providing:

an area of the common electrode to be larger than a total area of the input electrode and the output electrode, and wherein said notching step comprises:

notching the peripheral zone of the common electrode reaching the common electrode opposite the input electrode and output electrode.

26. The method of restraining a vibrational energy of a spurious vibration generated in excitation of a piezoelectric vibration device of claim 22, further comprising the steps of:

said providing step comprises providing the common electrode on one principal plane of the quartz plate which is twice to 10 times as thick as the input electrode and the output electrode forming on the other principal plane.

27. A method of restraining a vibrational energy of a spurious vibration generated in excitation of a piezoelectric vibration device, comprising the steps of:

providing a quartz plate having a pair of principal planes, an input electrode and an output electrode on a principal plane of the quartz plate, a grounding electrode interposed between the electrodes, in which the input electrode, the output electrode and the grounding electrode are respectively formed close to each other at regular intervals, and a common electrodes on the other principal plane of the quartz plate, corresponding to the input electrode, the output electrode, and the grounding electrode, and notching peripheral zones of each of the input electrode, the output electrode, and the common electrode, to restrain a vibrational energy of a spurious vibration generated in excitation of a piezoelectric vibration device.

28. The method of restraining a vibrational energy of a spurious vibration generated in excitation of a piezoelectric vibration device of claim 27, wherein said notching step further comprises:

notching on a portion where the vibrational energy of the spurious vibration, generated in excitation of the piezoelectric vibration device, is relatively greater than that of a principal vibration.

29. The method of restraining a vibrational energy of a spurious vibration generated in excitation of a piezoelectric vibration device of claim 27, wherein said providing step comprises providing:

each electrode in the form of rectangular shape, and said notching step comprises notching on one center of the far side where the input electrode and the output electrode are opposite to each other as well as on one center of the far side opposite to the common electrode.

30. The method of restraining a vibrational energy of a spurious vibration generated in excitation of a piezoelectric vibration device of claim 27, wherein said providing step comprises providing:

an area of the common electrode to be larger than a total area of the input electrode and the output electrode, and wherein said notching step comprises:

notching the peripheral zone of the common electrode reaching the common electrode opposite the input electrode and output electrode.

31. The method of restraining a vibrational energy of a spurious vibration generated in excitation of a piezoelectric vibration device of claim 22, further comprising the steps of:

said providing step comprises providing the common electrode on one principal plane of the quartz plate which is twice to 10 times as thick as the input electrode and the output electrode forming on the other principal plane.

32. A method of restraining a vibrational energy of a spurious vibration generated in excitation of a piezoelectric vibration device, comprising the steps of:

providing a quartz plate having a pair of principal planes, two pairs of input and output electrodes respectively including an input electrode and an output electrode, disposed on a principal plane of the quartz plate in parallel, in which the input electrode and the output electrode are formed close to each other at a regular interval, and a common electrodes on the other principal plane of the quartz plate, corresponding to the respective pairs of input and output electrodes, and notching peripheral zones of each of the input electrode, the output electrode, and the common electrode, to restrain a vibrational energy of a spurious vibration generated in excitation of a piezoelectric vibration device.

33. The method of restraining a vibrational energy of a spurious vibration generated in excitation of a piezoelectric vibration device of claim 27, wherein said notching step further comprises:

notching on a portion where the vibrational energy of the spurious vibration, generated in excitation of the piezoelectric vibration device, is relatively greater than that of a principal vibration.

34. The method of restraining a vibrational energy of a spurious vibration generated in excitation of a piezoelectric vibration device of claim 27, wherein said providing step comprises providing:

each electrode in the form of rectangular shape, and said notching step comprises notching on one center of the far side where the input electrode and the output electrode are opposite to each other as well as on one center of the far side opposite to the common electrode.

35. The method of restraining a vibrational energy of a spurious vibration generated in excitation of a piezoelectric vibration device of claim 27, wherein said providing step comprises providing:
 an area of the common electrode to be larger than a total area of the input electrode and the output electrode, and wherein said notching step comprises:
 notching the peripheral zone of the common electrode reaching the common electrode opposite the input electrode and output electrode.

36. The method of restraining a vibrational energy of a spurious vibration generated in excitation of a piezoelectric vibration device of claim 22, further comprising the steps of:
 said providing step comprises providing the common electrode on one principal plane of the quartz plate which is twice to 10 times as thick as the input electrode and the output electrode forming on the other principal plane.

* * * * *

UNITED STATES PATENT AND TRADEMARK OFFICE
CERTIFICATE OF CORRECTION

PATENT NO. : 6,236,140 B1
DATED : May 22, 2001
INVENTOR(S) : Hiroyuki Arimura

It is certified that error appears in the above-identified patent and that said Letters Patent is hereby corrected as shown below:

Column 18, lines 53 and 61, and Column 29, line 3,
"claim 27" should read -- claim 32 --

Column 20,
Line 3, "claim 22" should read -- claim 32 --

Signed and Sealed this

Thirteenth Day of May, 2003

JAMES E. ROGAN
*Director of the United States Patent and Trademark Office*